(12) United States Patent
Chung et al.

(10) Patent No.: US 8,232,549 B2
(45) Date of Patent: Jul. 31, 2012

(54) IRIDIUM COMPLEX CONTAINING CARBAZOLE-SUBSTITUTED PYRIDINE AND PHENYL DERIVATIVES AS MAIN LIGAND AND ORGANIC LIGHT-EMITTING DIODES CONTAINING THE SAME

(75) Inventors: Kwang Choon Chung, Yongin-si (KR); Hyun Nam Cho, Gunpo-si (KR); Jae Wook Lee, Busan (KR); Sung-Ho Jin, Busan (KR); Ji Hoon Yoo, Bucheon-si (KR); Jung Hwan Kim, Busan (KR)

(73) Assignees: Inktec Co., Ltd, Kyungki-do (KR); Dong-A University Research Foundation for Industry-Academy Cooperation, Busan (KR)

( * ) Notice: Subject to any disclaimer, the term of this patent is extended or adjusted under 35 U.S.C. 154(b) by 249 days.

(21) Appl. No.: 12/746,189

(22) PCT Filed: Dec. 4, 2008

(86) PCT No.: PCT/KR2008/007167
§ 371 (c)(1),
(2), (4) Date: Jun. 4, 2010

(87) PCT Pub. No.: WO2009/072821
PCT Pub. Date: Jun. 11, 2009

(65) Prior Publication Data
US 2010/0270540 A1    Oct. 28, 2010

(30) Foreign Application Priority Data

Dec. 6, 2007 (KR) .................. 10-2007-0126418

(51) Int. Cl.
*H01L 35/24* (2006.01)
(52) U.S. Cl. .................. 257/40; 257/E51.001
(58) Field of Classification Search ............ 257/40, 257/E51.001
See application file for complete search history.

(56) References Cited

U.S. PATENT DOCUMENTS

| | | |
|---|---|---|
| 7,154,114 B2 | 12/2006 | Brooks et al. |
| 7,816,016 B1 * | 10/2010 | Herron et al. ............ 428/690 |
| 2005/0175860 A1 | 8/2005 | Kim et al. |
| 2008/0061684 A1 | 3/2008 | Saitou et al. |

FOREIGN PATENT DOCUMENTS

| | | |
|---|---|---|
| WO | 2005/029606 A2 | 3/2005 |
| WO | 2005/080526 A2 | 9/2005 |
| WO | WO 2005097943 A1 * | 10/2005 |
| WO | 2006/073112 A1 | 7/2006 |

* cited by examiner

*Primary Examiner* — Anthony Ho
(74) *Attorney, Agent, or Firm* — The Webb Law Firm

(57) ABSTRACT

The present invention relates to a novel iridium complex into which carbazole-substituted pyridine derivatives and various substituents-substituted phenyl derivatives are introduced as main ligand and a electrophosphorescence diode containing the same as a dopant of a light-emitting layer. When the iridium complex according to the present invention is applied to an organic light-emitting diode, the heat-resistance property and the light-emitting property can be significantly improved as well as the light-emitting efficiency and the like can be significantly improved by doping the iridium complex compound into the light-emitting layer as compared to the conventional organic light-emitting diode.

10 Claims, 7 Drawing Sheets

【Figure 1】
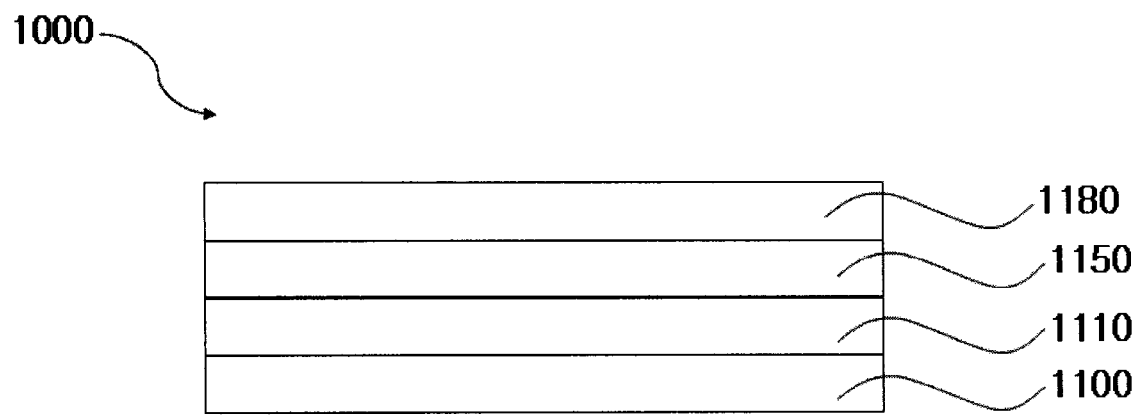
【Figure 2】
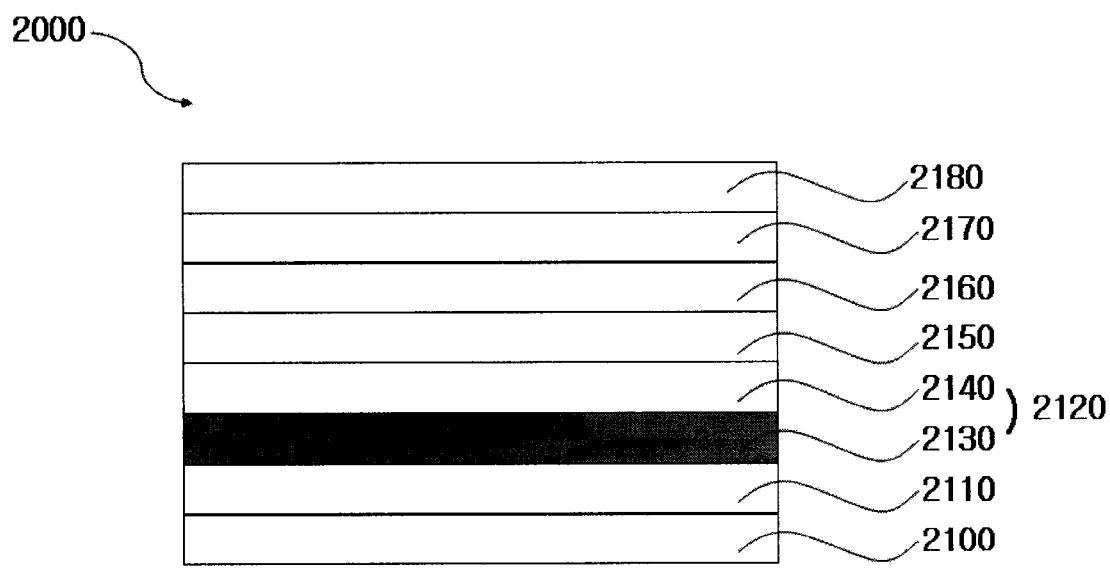

[Figure 3]
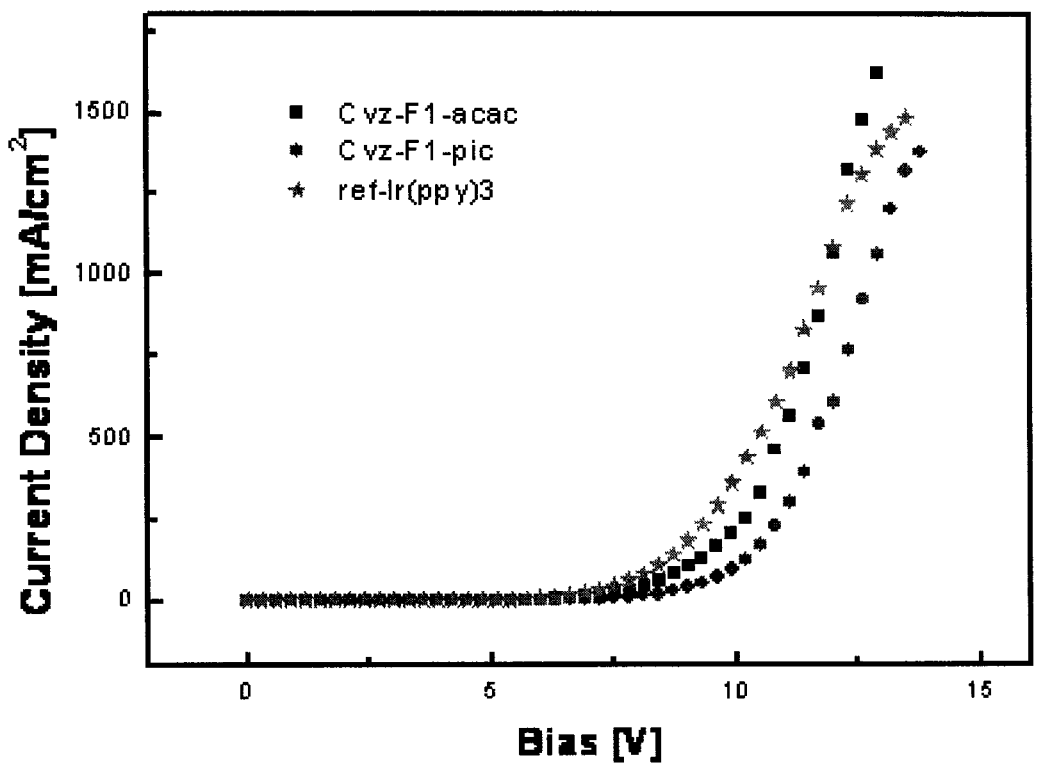
[Figure 4]
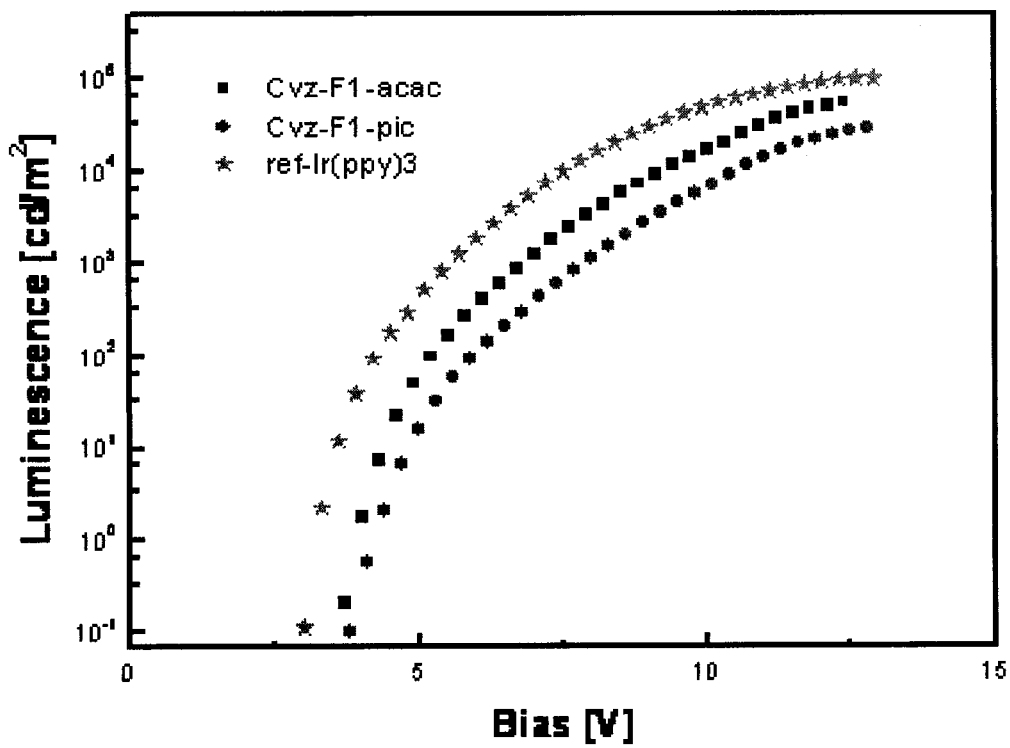

[Figure 5]
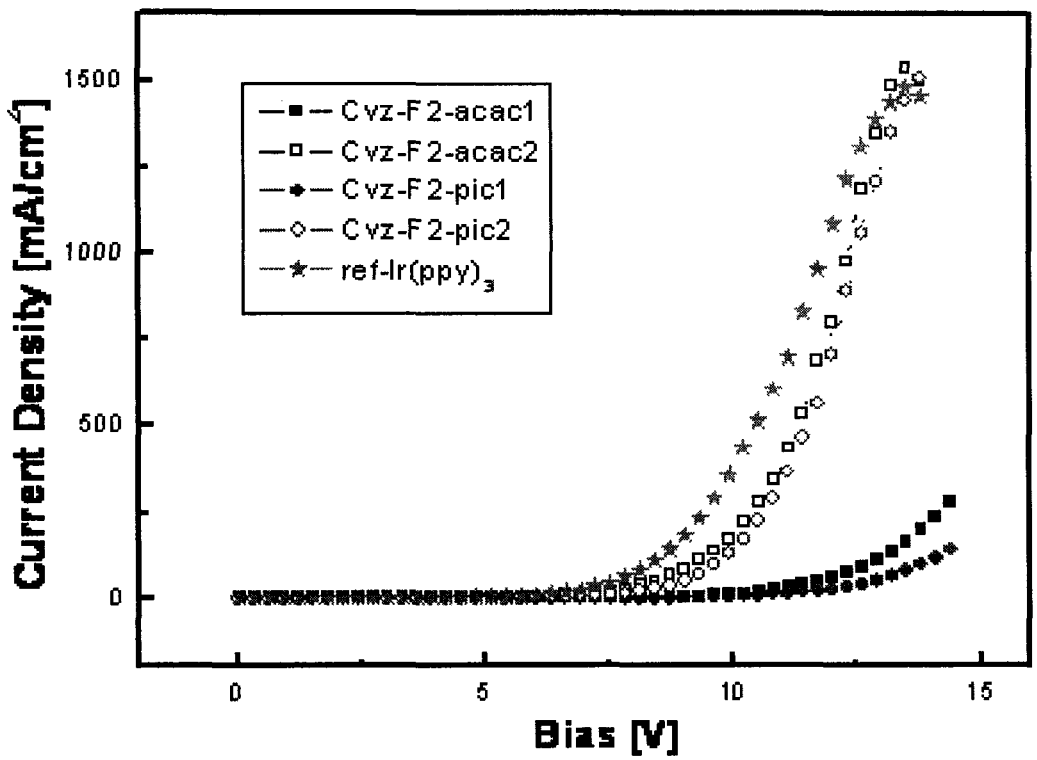
[Figure 6]
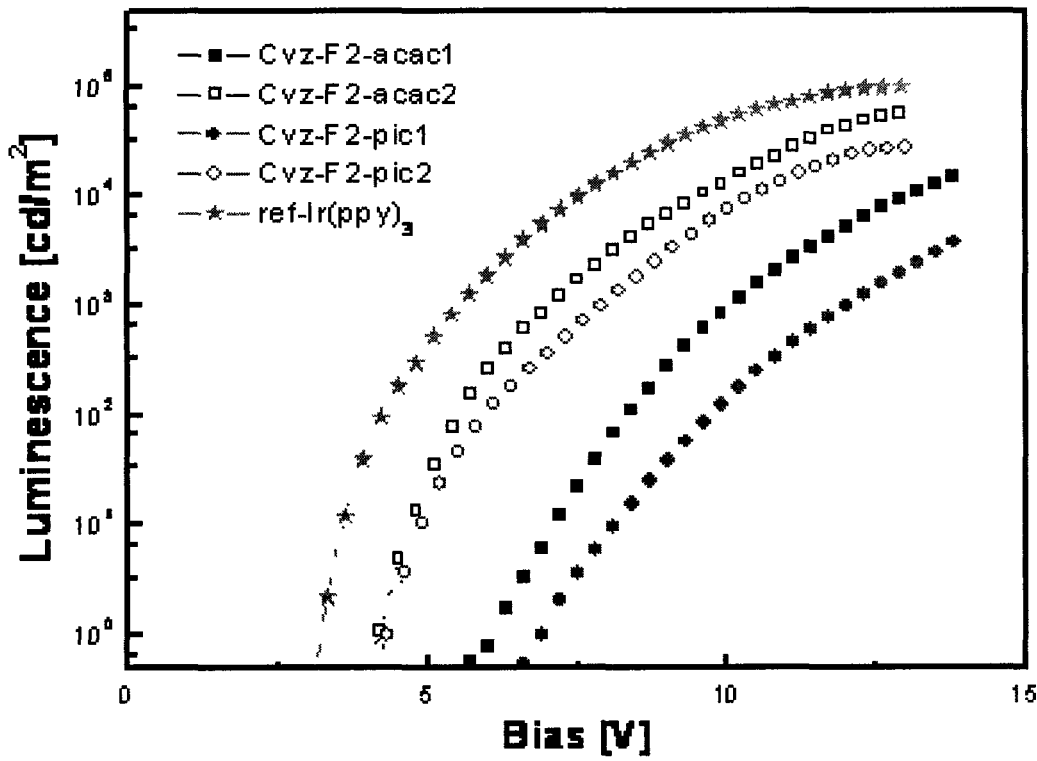

[Figure 7]
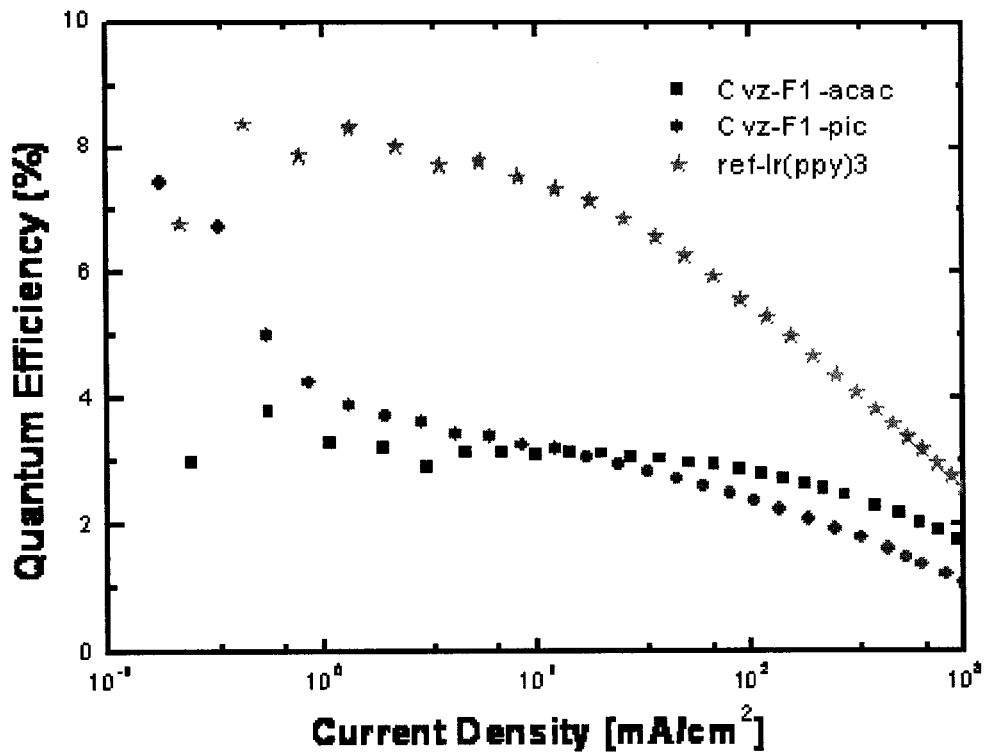
[Figure 8]
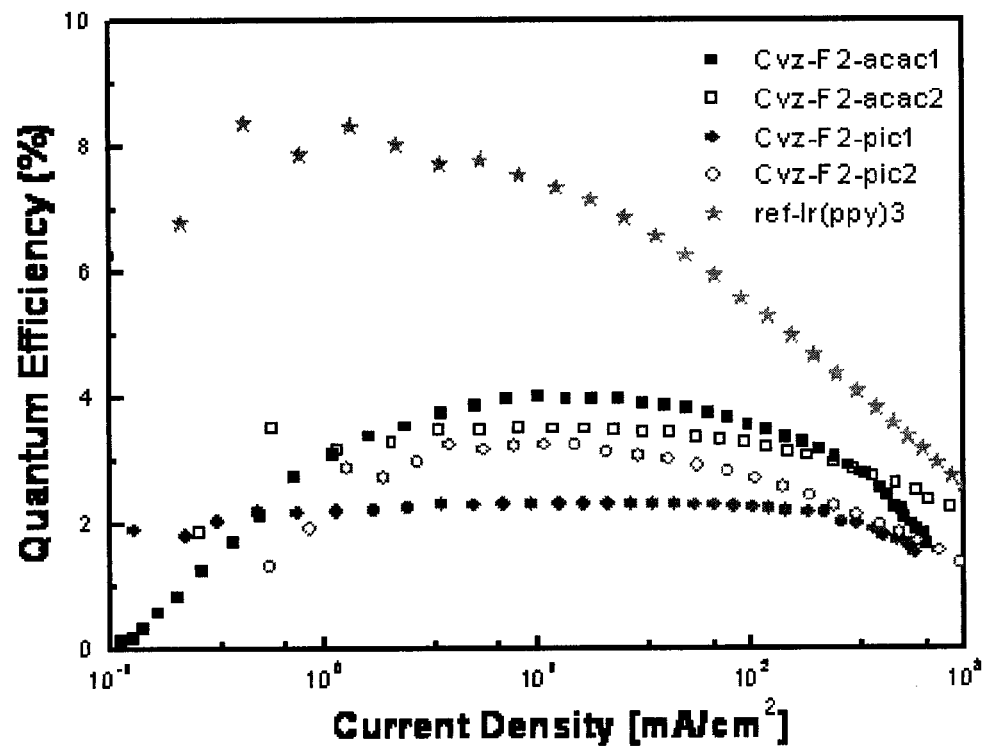

[Figure 9]
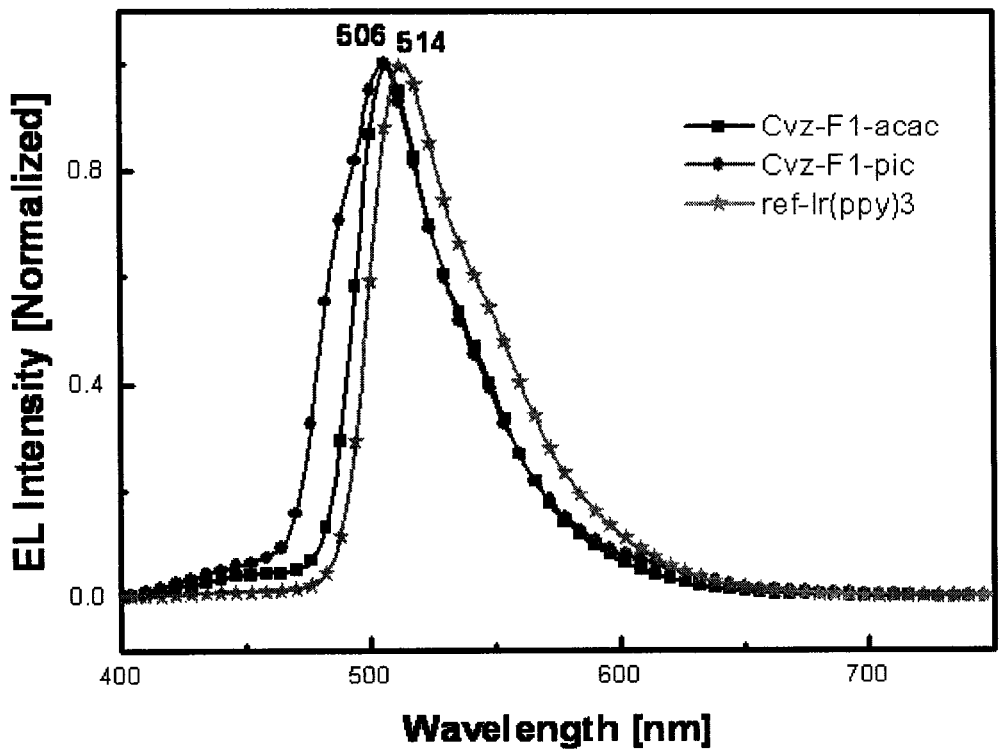
[Figure 10]
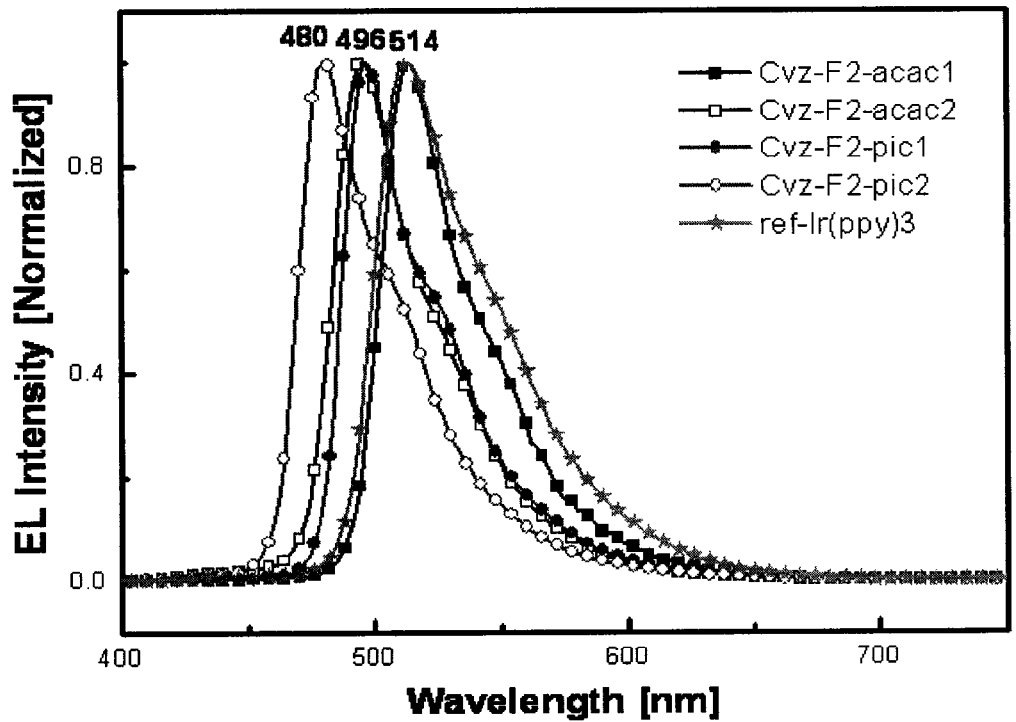

[Figure 11]
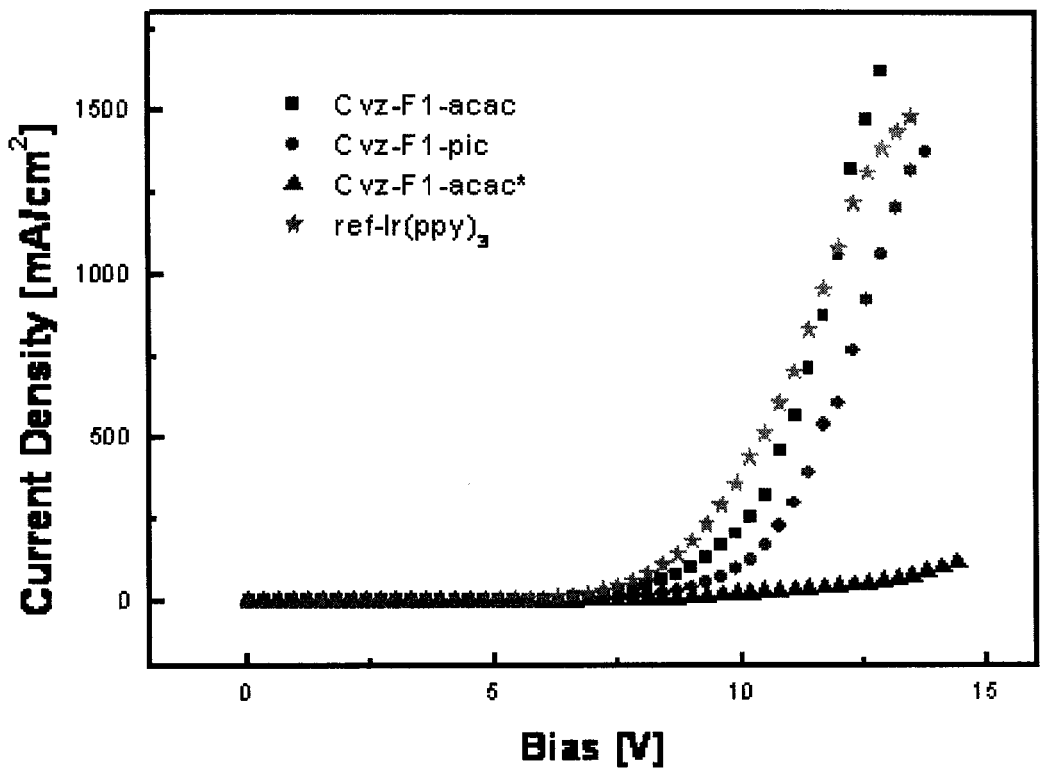
[Figure 12]
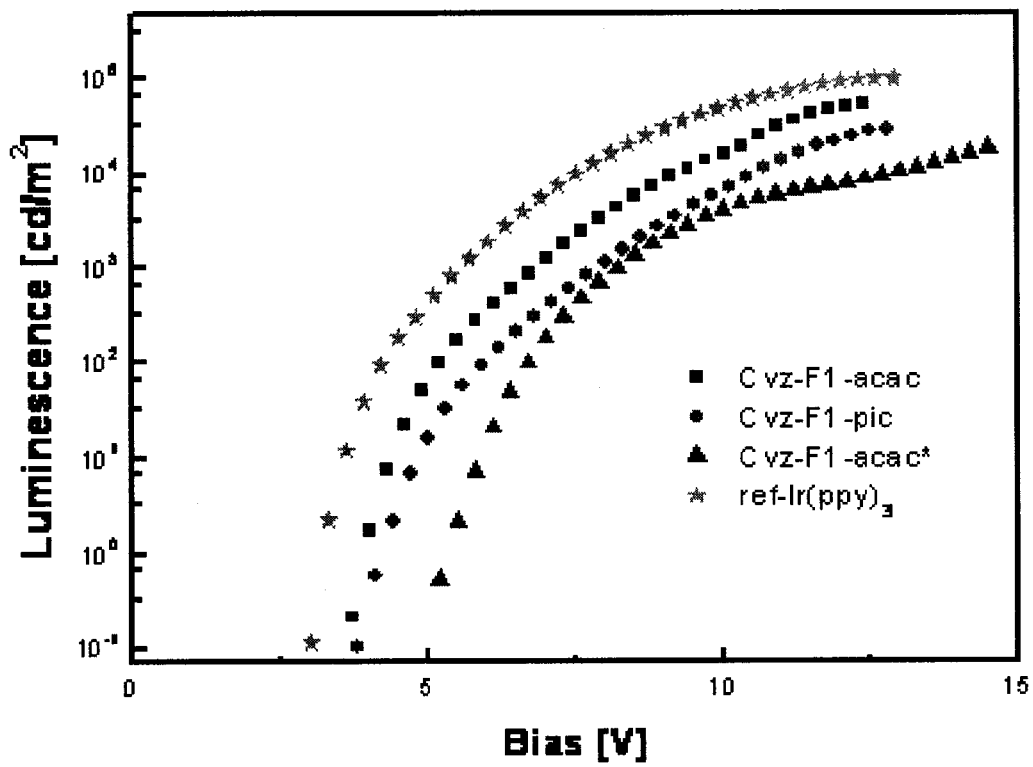

[Figure 13]
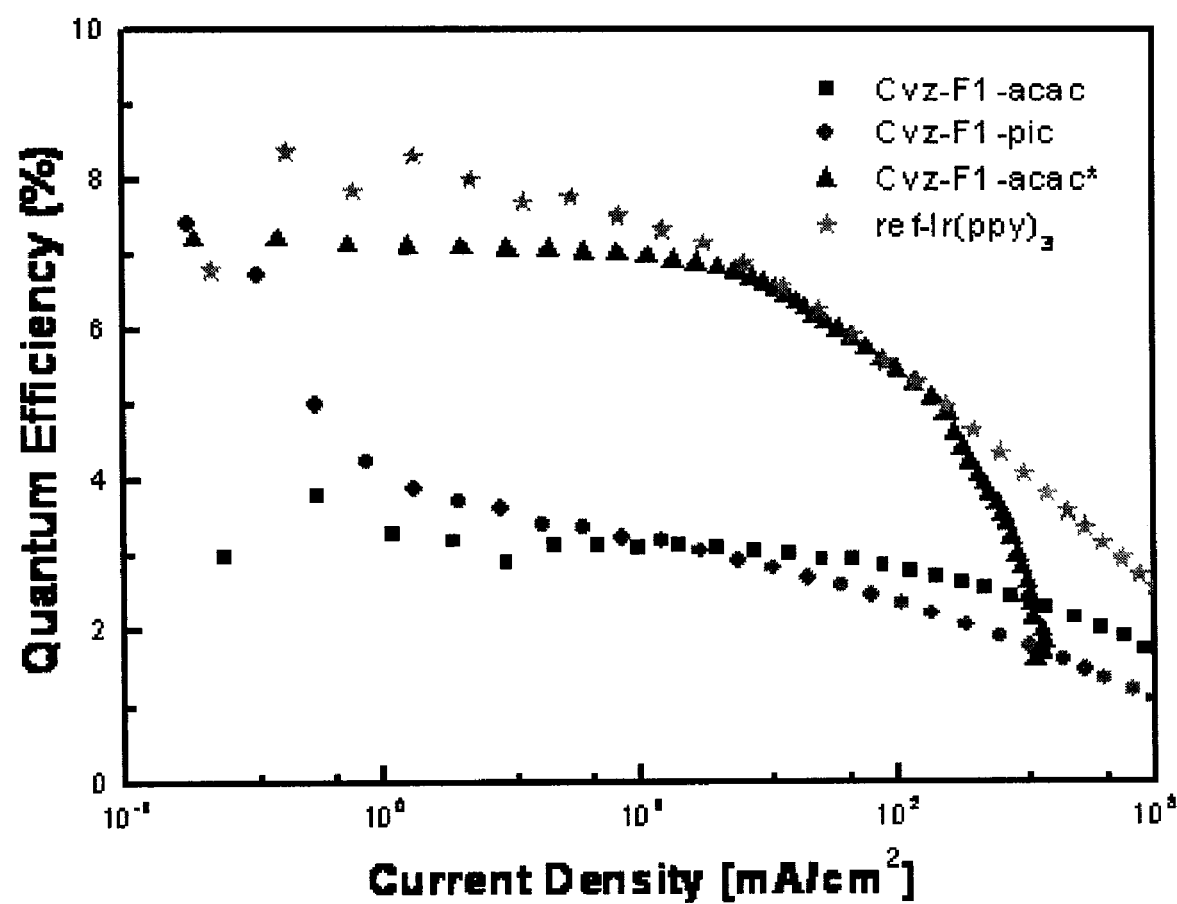

IRIDIUM COMPLEX CONTAINING CARBAZOLE-SUBSTITUTED PYRIDINE AND PHENYL DERIVATIVES AS MAIN LIGAND AND ORGANIC LIGHT-EMITTING DIODES CONTAINING THE SAME

TECHNICAL FIELD

The present invention relates to a novel iridium complex with phosphorescent properties and organic light-emitting diodes containing the same.

BACKGROUND ART

Recently, as a size of a display device becomes large, a demand of a flat display device such as a liquid crystal display (LCD), a plasma display panel (PDP), and the like increases. These flat display devices have a slow response speed and a limited viewing angle as compared to a cathode ray tube (CRT). Therefore, a study on other display devices for replacing these flat display devices has been progressed.

Among others, a study on an electroluminescence device has been progressed.

As the electroluminescence device in the related art, an inorganic electroluminescence device has mainly been used, but in the case of the inorganic electroluminescence device, it requires a driving voltage of alternating current (AC) 220V or more and should be manufactured in a vacuum state.

As a result, it is difficult to manufacture a large-sized electroluminescence device.

Due to the above-mentioned problems, a study on the organic light-emitting diode (OLED) using organic materials has been progressed. The organic light-emitting diode is a display using self-emission organic materials. When electric field is applied to the organic materials, the organic light-emitting diode (OLED) transfers electrons and holes from a cathode and an anode, respectively, combines them within the organic materials, and uses organic material electroluminescence emitting, as light, energy generated at this very moment.

In the organic light-emitting diode, the phenomenon emitting light may be largely divided into fluorescence and phosphorescence. The fluorescence is a phenomenon that emits light when organic molecules fall from a singlet excitation state to a ground state and the phosphorescence is a phenomenon that emits light when a triplet excitation state to a ground state.

Electrons and holes, which are injected into the organic light-emitting layer configuring the organic light-emitting diode, are recombined to form exciton and light of colors corresponding to energy band gaps of the light-emitting layer is implemented while electric energy of the excitation is converted into light energy. In this process, the singlet exciton where spin is 0 and the triplet excition where spin is 1 are generated at a ration of 1:3.

Therefore, when the organic light-emitting diode is generally doped with a fluorescence pigment, maximum internal quantum efficiency is limited to 25%. However, if a spin-orbital coupling is large, the singlet form and the triplet form are mixed, such that an inter-system crossing can be generated between the singlet state and the triplet state.

As a result, the triplet excition can be transitioned while emitting phosphorescence at the ground state. AS a result, all the triplet exciton can be used for emitting light and the quantum efficiency inside the organic light-emitting diode can be theoretically improved up to 100%.

The electrophophorescence diode, which can significantly improve the light-emitting efficiency of the organic light-emitting diode was developed by professor S. R. Forrest of Princeton University and professor M. E. Thompson's team in the United States (1999). It has been known that complex compounds of heavy atoms such as platinum (Pt), iridium (Ir), europium (Eu), Terbium (Tb), and the like indicate high phosphorescence efficiency. In the case of the platinum complex, the lowest triplet exciton is ligand-centered exciton (LC exciton), but in the case of the iridium complex, the triplet exciton having the lowest energy is metal-ligand charge transfer (MLCT). Therefore, the iridium complex forms the larger spin-orbital coupling to indicate high phosphorescence efficiency while having a much shorter triplet exciton lifespan, as compared to the platinum complex.

An electrophosphorescence diode emitting green light and red light was developed, but a blue electrophosphorescence diode having the excellent light-emitting efficiency, color coordinate, and lifespan is still not developed. As one example, a material called Flrpic (iridium (III) bis [2,2' (4'-difluorophenyl)-pyridinato-N,C2'] picolinate) has been developed, but cannot considered to be a perfect blue light-emitting material in terms of color purity.

DISCLOSURE

Technical Problem

The present invention proposes to solve the above problems. An object of the present invention provides a novel iridium complex having excellent thermal property, solubility for solvent and light-emitting efficiency. It is another object of the present invention provides an organic light-emitting diode containing the novel iridium complex.

Technical Solution

To achieve the above objects, the present invention provides an iridium complex represented by Chemical Formula (1) that has excellent heat-resisting property and light-emitting efficiency to be able to be used as a core material for an OLED and an organic light-emitting diode containing the same, and more specifically, the iridium complex is iridium complex into which carbazole-substituted pyridine derivatives and various substituents-substituted phenyl derivatives as main ligand are introduced.

[Chemical Formula 1]

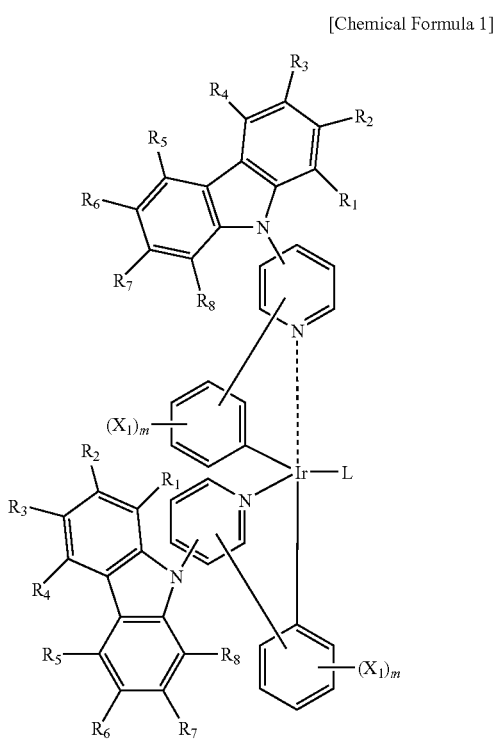

[In the Formula, L is organic ligand;

$R_1$ to $R_8$ independently represents hydrogen, linear or branched and saturated or unsaturated ($C_1$-$C_{20}$) alkyl with or without halogen substituent(s), ($C_3$-$C_{12}$) cycloalkyl, or ($C_3$-$C_{12}$) cycloalkyl ($C_1$-$C_{20}$) alkyl;

$X_1$ represents hydrogen, halogen, cyano, linear or branched and saturated or unsaturated ($C_1$-$C_{20}$) alkyl, ($C_1$-$C_{20}$) alkoxy, tri ($C_1$-$C_{20}$) alkylsilyl, tri ($C_5$-$C_{20}$) arylsilyl, ($C_3$-$C_{12}$) cycloalkyl, or ($C_5$-$C_{20}$) aryl, and the alkyl, alkoxy, or aryl of $X_1$ may be further substituted by one or more substituent(s) selected from halogen, ($C_1$-$C_{20}$) alkylsilyl, ($C_5$-$C_{20}$) arylsilyl, mono or di ($C_1$-$C_{20}$) alkylamino, or amino;

m is an integral number of 1 to 4.]

Meanwhile, in the iridium complex indicating the phosphorescence property, the main ligand is a main factor that determines a light-emitting color. In particular, since the light-emitting property of the main ligand is changed according to the electron density of nitrogen (N) contained in the ligand, the iridium complex of the above Chemical Formula (1) according to the present invention is introduced with carbazole-substituted pyridine derivatives and various substituents-substituted phenyl derivatives such as electron withdrawing [for example: halogen or cyano] or electron donating [for example: alkyl or alkoxy], as the main ligand, making it possible to control the light-emitting color. For example, the electron density of phenyl is reduced by the electron withdrawing substituents-substituted phenyl derivatives as the main ligand and in the case of the carbazole-substituted pyridine derivatives, since the electron density of nitrogen contained in the structure significantly increases as compared to the iridium complex developed according to the related art, it can light-emit blue rather than emitting green as in the related art.

Further, the various substituents-substituted phenyl derivatives and the carbazole-substituted pyridine derivatives as main ligand, which are introduced into the iridium complex of the above Chemical Formula (1) according to the present invention, can be substituted at various positions of ortho (o-), meta (m-), and para (p-). Due to the substitution with various functional groups, the iridium complex of the above Chemical Formula (1) according to the present invention can commerically be used for a generally used organic solvent as well as improve interface properties with the electrode when it is applied to the organic light-emitting diode.

In particular, in carbazole-substituted pyridine derivatives, the carbazole can be substituted at the positions of ortho (o-), meta (m-), and para (p-) of the nitrogen of the pyridine, preferably, is introduced into the para position of the pyridine. Also, in various substituents-substituted phenyl derivatives, the substituent(s) is mainly substituted at the positions of ortho (o-) and para (p-).

The iridium complex of Chemical Formula (1) according to the present invention is introduced with the carbazole-substituted pyridine derivatives and the substituents-substituted phenyl derivatives as a main ligand as well as a separate ancillary ligand (L). The ancillary ligand (L) is selected to adjust fine colors in the light-emitting property of the iridium complex. In particular, it is preferable to form a small conjugated structure so that the iridium complex of Chemical Formula (1) according to the present invention can emit purer blue. The ancillary ligand (L) of the iridium complex of Chemical Formula (1) includes the following structure, but is not limited thereto.

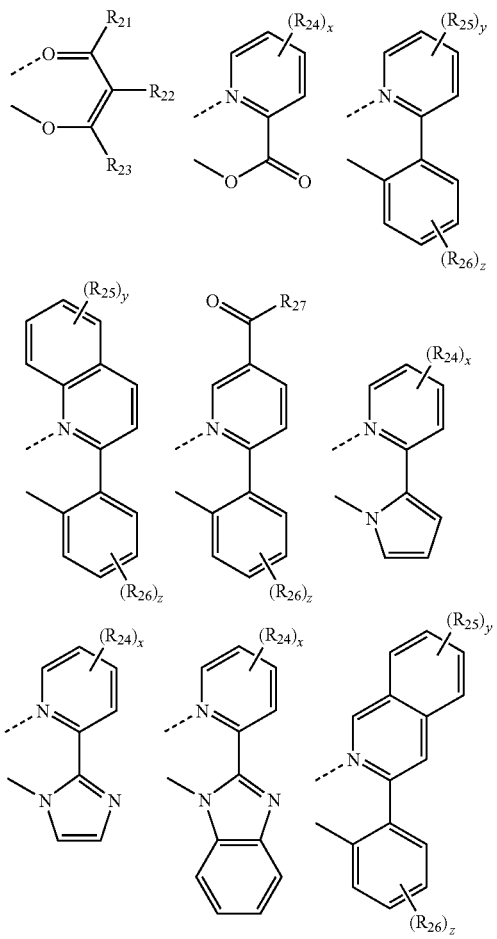

[wherein, $R_1$ to $R_{23}$ independently represent hydrogen, linear or branched and saturated or unsaturated ($C_1$-$C_{10}$) alkyl with or without halogen substituent(s), phenyl with or without ($C_1$-$C_{10}$) alkyl substituent(s) or halogen; $R_{24}$ to $R_{26}$ independently represent hydrogen, linear or branched and saturated or unsaturated ($C_1$-$C_{10}$) alkyl with or without halogen substituent(s), ($C_1$-$C_{10}$) alkylsilyl, or halogen; $R_{27}$ represents linear or branched and saturated or unsaturated ($C_1$-$C_{10}$) alkyl with or without halogen substituent(s), phenyl with or without ($C_1$-$C_{10}$) alkyl substituent(s), or halogen; x, y, and z are independently an integer 1 to 4.]

The ancillary ligand (L) contained in the organic light-emitting compound according to the present invention is exemplified in the following structure.

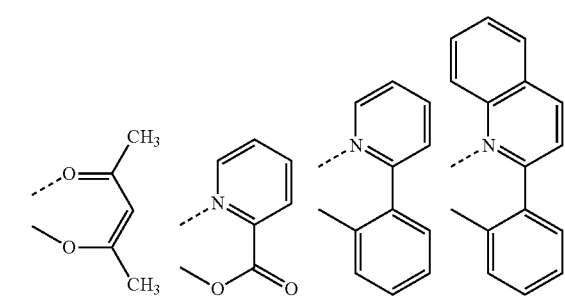

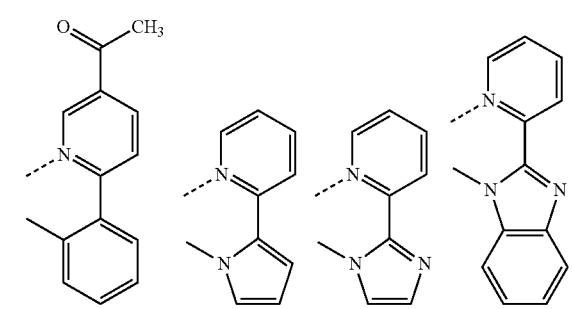

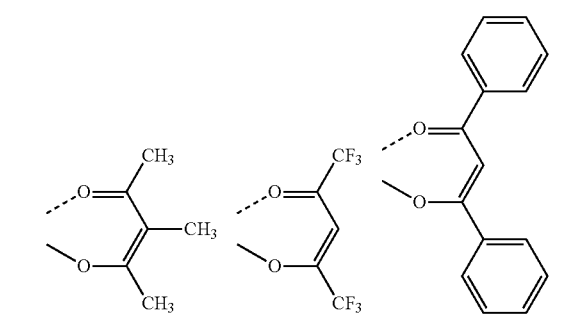

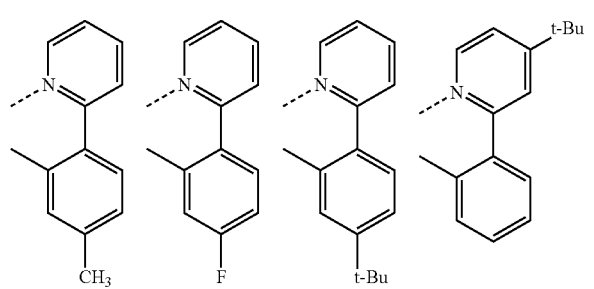

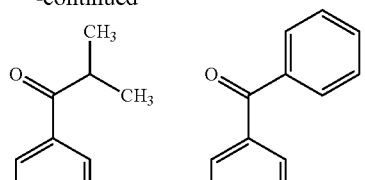

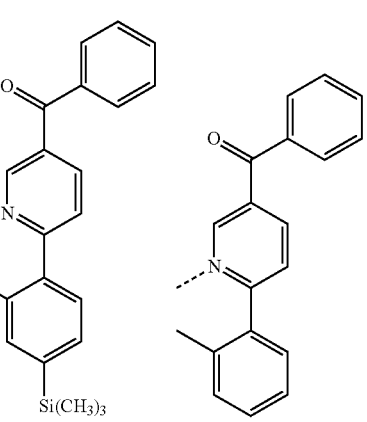

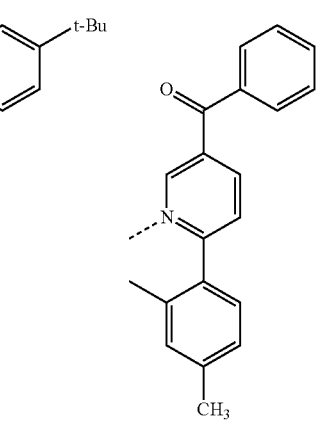

Concretely exemplifying the compound of Chemical Formula (1), $R_1$ to $R_8$ independently represent hydrogen, methyl, ethyl, n-propyl, i-propyl, n-butyl, t-butyl, cyclopropyl, cyclobutyl, cyclopentyl, cyclohexyl, cycloheptyl, cyclopropylmethyl, or cyclobutylmethyl; $X_1$ represents hydrogen, fluoro (F), cloro (Cl), cyano, methyl, ethyl, n-propyl, i-propyl, n-butyl, i-butyl, t-butyl, methoxy, ethoxy, n-propoxy, t-butoxy, trifluoromethyl, trimethylsilyl, triphenylsilyl, cyclopropyl, cyclobutyl, cyclohexyl, phenyl, naphthyl, anthryl, aminomethyl, aminoethyl, or aminobutyl; m is an integer 1 or 2.

The iridium complex according to the present invention may be exemplified by the following compounds, but the present invention is not limited to the following compounds.

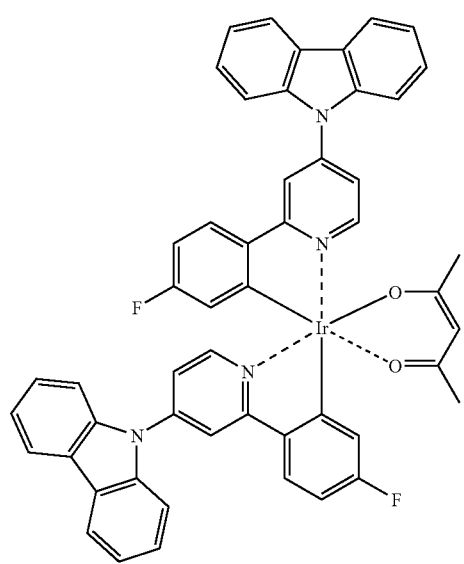
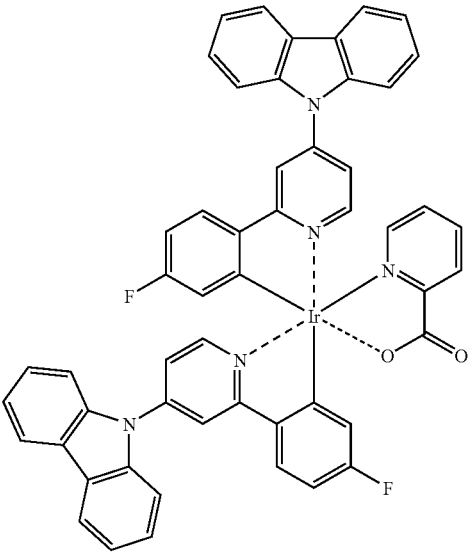
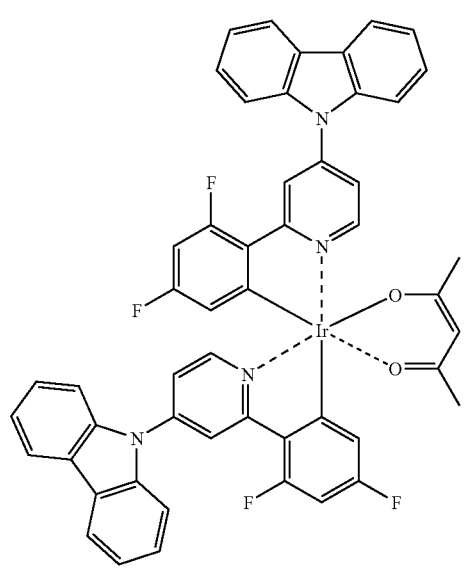
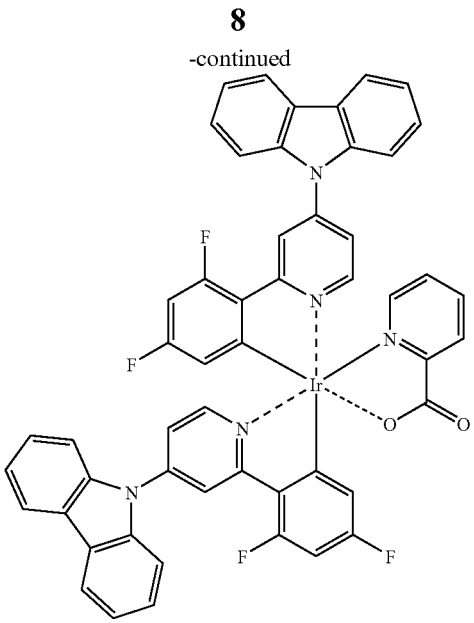
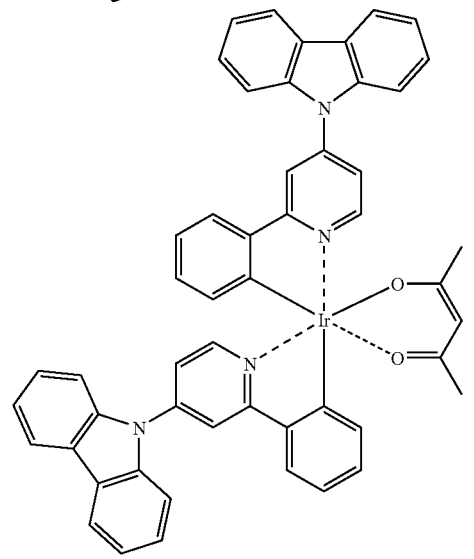
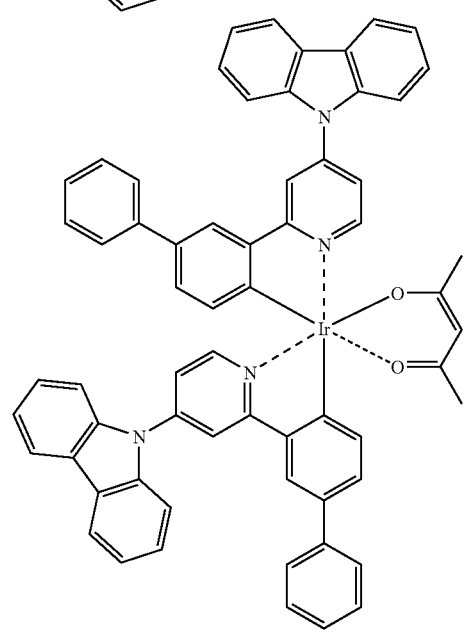

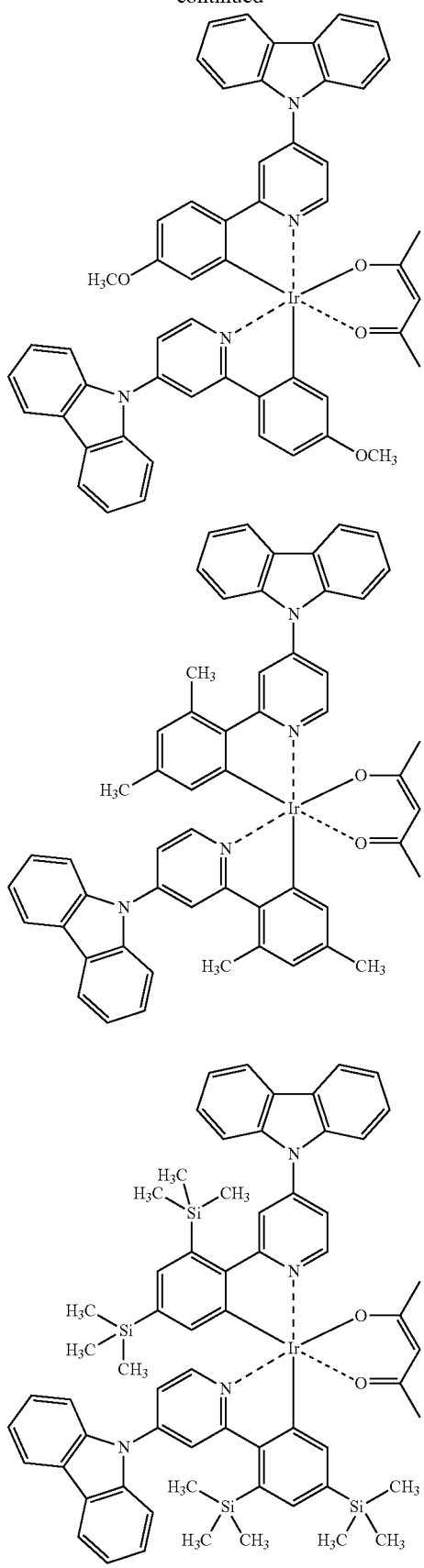
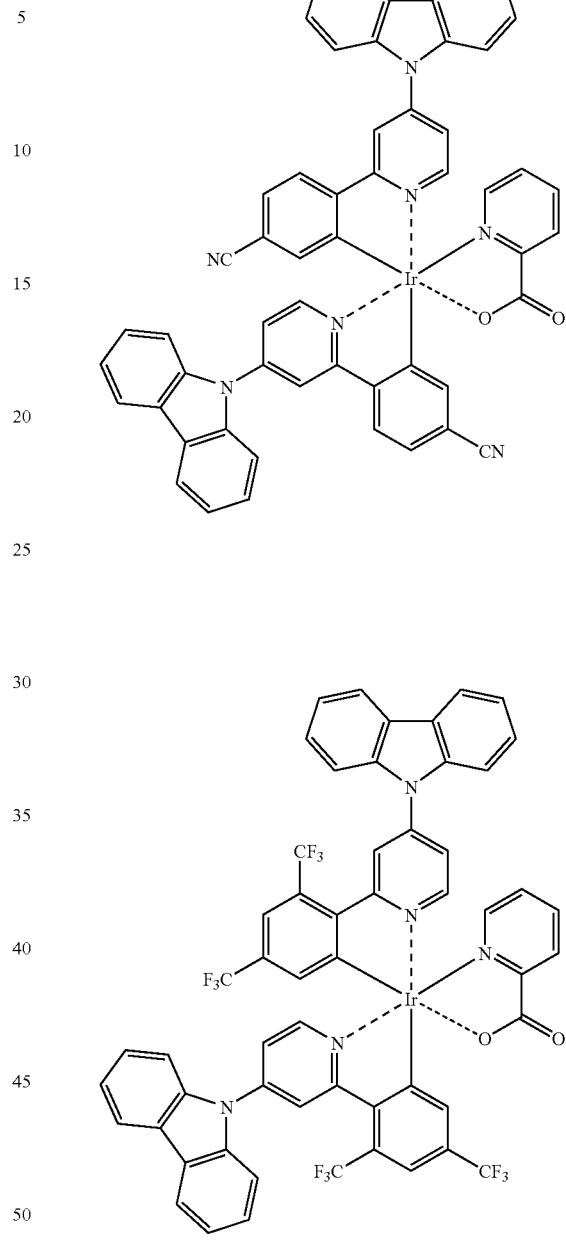

Meanwhile, if the structure of the final material is same, as the preparing methods of the iridium complex represented by Chemical Formula (1) of the present invention, any known methods can be used in addition to the method described in the specification. In other words, the solvent, reaction temperature, concentration, or catalyst, etc. for preparing the iridium complex represented by Chemical Formula (1) of the present invention are particularly not limited and do not have an effect on the preparing yield. As a concrete example, the reaction equation 1 will be described below.

[Reaction Equation 1]
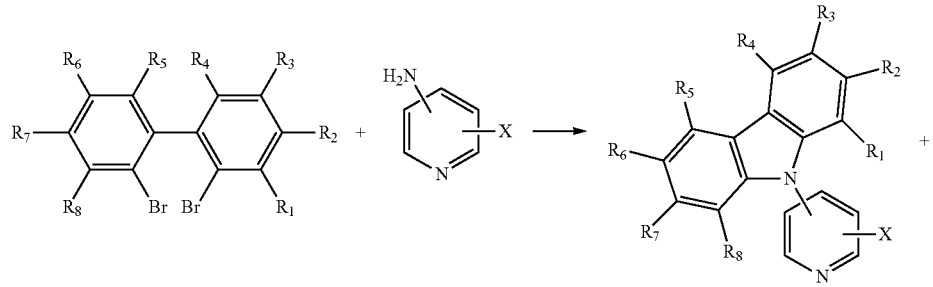
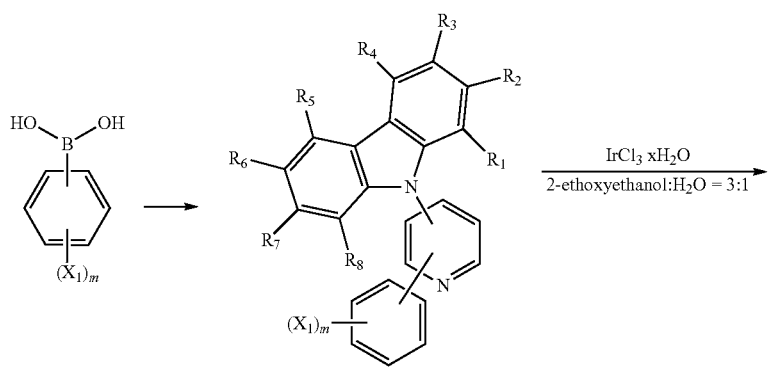
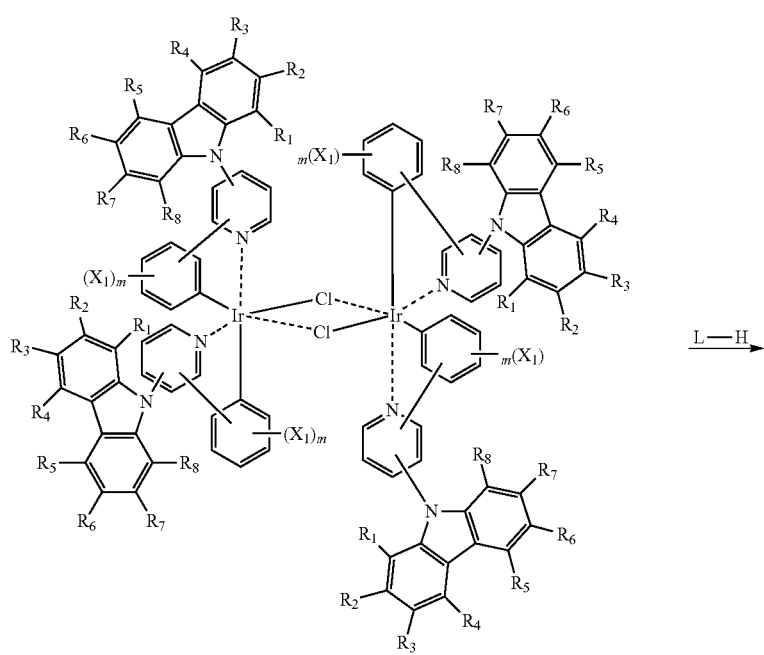

-continued

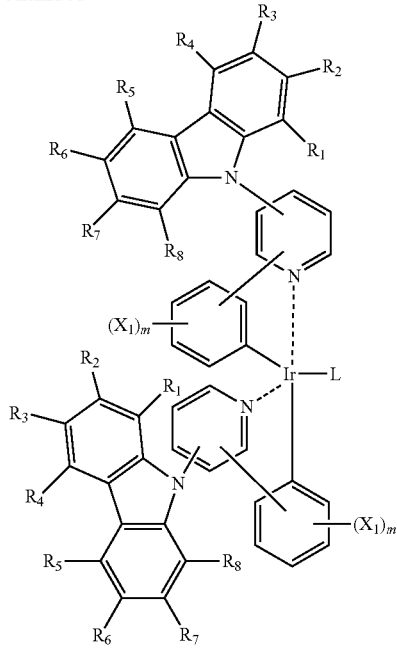

[Chemical Formula 1)

[wherein, X represents halogen; L, $R_1$, $R_2$, $R_3$, $R_4$, $R_5$, $R_6$, $R_7$, $R_8$, $X_1$ and m are defined as in Chemical Formula (1).]

As shown in the reaction equation 1, the carbazole-substituted pyridine derivatives are syrthesized by reacting 2, 2'-dibromo-diphenyl with halogenamino pyridine and then synthesized with carbazole pyridine-substituted phenyl main ligand by a Suzuki synthetic method reacting with various substituents-substituted phenylboronic acid under a solvent of $Na_2CO_3$, $Pd(PPh_3)_4$, toluene, water, ethanol. Next, the mixture of the synthesized carbazole pyridine-substituted phenyl main ligand and iridiumchloride hydrate ($IrCl_3 3H_2O$) is dissolved in an appropriate solvent and then mixed to synthesize chloride-bridged dimer. The ancillary ligand (L-H) and appropriate solvent is mixed in the finally obtained chloride-bridged dimer to synthesize the iridium complex into which the finally carbazole-substituted pyridine derivatives and various substituents-substituted phenyl derivatives are introduced as the main ligand. As can be from the measurement results of the light-emitting property of FIGS. 3 to 13, the iridium complex synthesized through the above-mentioned method can control the maximum light-emitting peak approximately from 480 nm to 514 nm and the light-emitting property thereof can be controlled from blue to sea green.

Further, the present invention provides the organic light-emitting diode containing the iridium complex represented by the above Chemical Formula (1). The organic light-emitting diode includes a first electrode that serves as an anode and a second electrode that is formed facing the first electrode and serves as a cathode and can be formed in a single layer form where the light-emitting layer containing the iridium complex according to the present invention is stacked between the first electrode and second electrode.

Also, the organic light-emitting diode includes a buffer layer between the first electrode and the light-emitting layer and can be formed in a multi-layer form that includes an electron transferring layer and an electron injection layer between the light-emitting layer and the second electrode. At this time, the buffer layer includes a hole injection layer that is stacked on the upper portion of the first electrode and a hole transfer layer that is stacked on the upper portion of the hole injection layer.

Meanwhile, the iridium complex of Chemical Formula (1) according to the present invention is included as a dopant that can interact with other host materials included in the light emitting layer and preferably, is included at a concentration of 3 to 20 wt % based on a total amount of the light emitting layer, making it possible to obtain the emission from blue to sea green. Hereinafter, the organic light-emitting diode applied with the iridium complex according to the present invention will be described.

FIG. 1 schematically shows an organic light-emitting diode (1000) in a single layer form to which the iridium complex can be applied according to one embodiment of the present invention. The organic light-emitting diode (1000) in the single layer form has a structure where a first electrode (1110), a light emitting layer (1150), and a second electrode (1180) are sequentially stacked. The substrate (1100) may be manufactured in a material such as glass, plastic, etc.

Meanwhile, the first electrode (1110) and the second electrode (1180) serve as, for example, the anode and cathode, respectively. The first electrode (1110) uses a material where work function of the second electrode (1180) is large.

In particular, according to the present invention, the first electrode (1110), which is a material suitable for injecting holes that are a positive-charged carrier, may be metal, mixed metal, alloy, metal oxide, mixed metal oxide, or conductive polymer. In detail, as the first electrode (1110), materials such as mixed metal oxide, for example, indium-tin oxide (ITO), fluorine doped tin oxide (FTO), ZnO—$Ga_2O_3$, or ZnO—$Al_2O_3$, $SnO_2$—$Sb_2O_3$ etc., conductive polymer, for example, polyaniline, polythiophene, etc. can be used. According to the embodiment, ITO is preferably used.

To the contrary, the second electrode (1180), which is a material suitable for injecting holes that are a negativecharged carrier, may be selected from gold, aluminum, copper, silver, or alloy thereof; aluminum, indium, calcium, barium, magnesium, or alloy thereof such as calcium/aluminum alloy, magnesium/silver alloy, aluminum/lithium alloy, and the like; or if necessary, metal belonging to rare earth, lanthanide, actinide. Preferably, aluminum or aluminum/calcium alloy is used.

Meanwhile, in the light emitting layer stacked between the first electrode (1110) and the second electrode (1180), the iridium complex of Chemical Formula (1) according to the present invention is used as a dopant. In connection with this, the light emitting layer (1150) includes a host being a light emitting material so that the light emitting efficiency can be increased by suppressing the change in color purity and an energy loss process such as extinction phenomenon. In particular, since the case of the iridium complex of Chemical Formula (1) according to the present invention indicates the light emitting color approximately from blue to sea blue, the energy light-emitted from the host included in the light emitting layer can select the host so that it can be well transmitted to the iridium complex being the dopant. The host included in the light emitting layer (1150) according to the present invention can include all the hosts, such as a host having fluorescence property and a host having phosphorescence property. Preferably, a host has phosphorescence property.

In particular, the host having the phosphorescence property usable in connection with the present invention may include aryl amine system, carbazole system, Spiro system. In detail, the host may include 4,4-N,N-dicarbazole-biphenyl (CBP), 1,3-bis (9-carbazolyl) benzene (mCP), poly (vinylcarbazole) (PVK), etc. Preferably, CBP and mCP can be used.

According to the preferred embodiment, the light emitting layer (1150) is stacked on the upper portion of the first electrode (1110) approximately at a thickness of 5 to 200 nm, preferably at a thickness of 50 to 10 nm. The iridium complex of Chemical Formula (1) according to the present invention is included as a dopant at a concentration of 3 to 20 wt %, preferably 5 to 10 wt % with respect to the light-emitting layer (1150).

The iridium complex of Chemical Formula (1) according to the present invention can be applied to the organic light-emitting diode (1000) in the above-mentioned single layer form as well as the organic light-emitting diode in a multi-layer form including a separate layer for transporting electrons/holes between the light emitting layer and the electrode. FIG. 2 schematically shows a cross section of the organic light-emitting diode (2000) in the multi layer form that can applied to the iridium complex synthesized according to the present invention. As shown in FIG. 2, the organic light-emitting diode (2000) has a form where a substrate (2100), a first electrode, a buffer layer (2120) including a hole injection layer (HIL) (2130) and a hole transfer layer (HTL) (2140), a light-emitting layer (2150), an electron transfer layer (ETL) (2160), an electron injection layer (EIL) (2170), and a second electrode (2180) are sequentially stacked.

In the organic light-emitting diode in a multi layer form configured as above, the buffer layer (2120) stacked between the first electrode (2110) and the light-emitting layer (2150) is functioned to improve the interface property between the material used as the first electrode (2110) and the light-emitting layer (2150) or to stably supply holes to the light-emitting layer (2150). The buffer layer (2120) can be functionally divided into the hole injection layer (2130) and the hole transfer layer (2140).

At this time, the hole injection layer (2130) configuring the buffer layer (2120) improves the interface property between the material such as ITO, etc., used as the first electrode (2110) and the organic material used as the hole transfer layer (2140) as well as makes the surface of ITO by being applied on the upper portion of ITO having uneven surface soft, making it possible to improve the conductivity and light-emitting efficiency. In particular, the hole injection layer (2130) selects, in particular, a material having suitable conductivity as a material having an intermediate value between the work function level of ITO and the HOMO level of the hole transfer layer (2140) in order to control the difference between the work function level of ITO, etc. used as the first electrode (2110) and the HOMO level of the hole transfer layer (2140). In connection with the present invention, as a material forming the hole injection layer (2120), aromatic amines such as copper-phthlalocyanine (CuPC), N,N'-di-naphthyl-N,N'-phenyl-(1,1'-biphenyl)-4,4'-diamine (NPD), α-NPD, and the like, poly (3,4-ethylenedixoythiophene)-poly(styrene sulfonate) (PEDOT), which is polythiophene derivatives, as conductive polymer can be used. In particular, the embodiment of the present invention used PEDOT. The hole injection layer (2130) may be coated on the upper portion of the first electrode (2110) at a thickness of 20 to 200 Å.

Meanwhile, the hole transfer layer (2140) is formed on the upper portion of the hole injection layer (2130) so that holes input through the hole injection layer (2130) can be stably supplied to the light-emitting layer (2150). In this case, a material, which makes the HOMO level of the hole transfer layer (2140) higher than the HOMO level of the light-emitting layer (2150) is selected to smoothly transport and transfer the holes. As a material usable as the hole transfer layer (2140) in connection with the present invention, the hole transporting materials such as N,N'-diphenyl-N,N'-(3-methylphenyl)-1,1'-biphenyl-4,4'-diamine (TPD), α-TDP, etc. can be used. The hole transferring layer can be deposited on the upper portion of the hole injection layer (2130) at a thickness of 10 to 100 nm.

Each material used for the hole injection layer and the hole transfer layer substantially functions as both the hole injection layer and the hole transfer layer rather than as any one of the hole injection layer and the hole transfer layer.

In other words, it is to be noted that the material used as the hole injection layer can improve the transfer and transportation of holes as well as the material used as the hole transfer layer can improve the injection of hole.

Consequently, it was described in the above description that the material used for the hole injection layer and the hole transfer layer can be divided, but the materials are only a selection problem. As a whole, these materials are included a buffer layer (2120) between the first electrode (2110) and the light-emitting layer (2120).

Meanwhile, according to the present invention, the electron injection layer (2170) and the electron transfer layer (2160), which can correspond to the hole injection layer (2130) and the hole transfer layer (2140), are formed between the light-emitting layer (2150) and the second electrode (2160). The electron injection layer (2170) is to lead to the smooth electron injection. The electron injection layer (2170) uses alkali metal or alkali earth metal ion form such as LiF, $BaF_2$, CsF, etc. unlike other charge transfer layer and can be configured to lead to a doping for the electron transfer layer (2160) by these metal cations.

Meanwhile, the electron transfer layer (2160) is formed as a material containing chemical ingredient that mainly attracts electrons. To this end, the electron transfer layer (2160) requires high electron mobility and stably supplies electrons to the light-emitting layer (2150) by the smooth electron transportation. At this time, since too strong electron acceptor ingredient can quench electrons, it is preferable to use an appropriate electron acceptor ingredient to improve the electron mobility. The electron transfer layer usable according to the present invention includes $Alq_3$ and oxadizole ingredients. In detail, the electron transfer layer includes azole compounds and the like, such as Tris (8-hydroxyquinolinato) aluminum ($Alq_3$); 2-(4-biphenyl)-5-(4-tert-butyl)-1,3,4-oxadizole (PBD). In the embodiment of the present invention, $Alq_3$ is used as the electron transfer layer (2160), wherein the electron transfer layer (2160) can be deposited on the upper portion of the light-emitting layer (2150) at a thickness of 5 to 150 nm.

Meanwhile, although not shown, in the case where the holes input through the hole injection layer (2130) and the hole transfer layer (2140) proceeds to the second electrode (2180) via the light-emitting layer (2150), since the lifespan and efficiency of the device can be reduced, a hole blocking layer (HBL) having very low HOMO level can be formed between the light-emitting layer (2150) and the electron transfer layer (2160). In connection with the present invention, as materials usable for the hole blocking layer, 2,9-dimethyl-4,7-diphenyl-1,10-phenanthroline (BCP) can be used. The electron blocking layer can be deposited on the upper portion of the light-emitting layer (2150) at a thickness of approximately 5 to 150 nm.

As described above, the iridium complex synthesized according to the present invention indicates various wavelengths corresponding to an area from blue to sea green.

It can be appreciated from the measurement results of the electrical characteristics as shown in FIGS. 3 to 13 that the organic light-emitting diode using the improved iridium complex as the dopant of the light-emitting layer as described above can significantly improve electrical characteristics.

Also, it can be confirmed from FIGS. 9 and 10 that the organic light-emitting diode using the improved iridium complex as the dopant of the light-emitting layer can control the maximum light-emitting peak approximately from 480 nm to 514 nm and control the light-emitting property from blue to sea green.

DESCRIPTION OF DRAWINGS

The above and other objects, features and advantages of the present invention will become apparent from the following description of preferred embodiments given in conjunction with the accompanying drawings, in which:

FIG. 1 is a schematic cross sectional view of an organic light-emitting diode in a single layer form to which iridium complexes synthesized according to the present invention are applied;

FIG. 2 is a schematic cross sectional view of an organic light-emitting diode in a multi-layer form to which iridium complexes synthesized according to the present invention are applied;

FIG. 3 is a graph showing a measurement result of voltage-current density of the iridium complex synthesized according to first and second embodiments of the present invention and Ir $(ppy)_3$ according to a comparative example;

FIG. 4 is a graph showing a measurement result of voltage-luminescent brightness of the iridium complex synthesized according to first and second embodiments of the present invention and Ir $(ppy)_3$ according to a comparative example;

FIG. 5 is a graph showing a measurement result of voltage-current density of the iridium complex synthesized according to third and fourth embodiments of the present invention and Ir $(ppy)_3$ according to a comparative example;

FIG. 6 is a graph showing a measurement result of voltage-luminescent brightness of the iridium complex synthesized according to third and fourth embodiments of the present invention and Ir $(ppy)_3$ according to comparative example;

FIG. 7 is a graph showing a measurement result of current density-luminescent efficiency of the organic light-emitting diode that uses the iridium complex synthesized according to first and second embodiments of the present invention and Ir $(ppy)_3$ according to a comparative example as a dopant of a light-emitting layer;

FIG. 8 is a graph showing a measurement result of current density-luminescent efficiency of the organic light-emitting diode that uses the iridium complex synthesized according to third and fourth embodiments of the present invention and Ir $(ppy)_3$ according to a comparative example as a dopant of a light-emitting layer;

FIG. 9 is a graph showing a measurement result of electroluminescence (EL) intensity of the organic light-emitting diode that uses the iridium complex synthesized according to first and second embodiments of the present invention and Ir $(ppy)_3$ according to a comparative example as a dopant of a light-emitting layer;

FIG. 10 is a graph showing a measurement result of electroluminescence (EL) intensity of the organic light-emitting diode that uses the iridium complex synthesized according to third and fourth embodiments of the present invention and Ir $(ppy)_3$ according to a comparative example as a dopant of a light-emitting layer;

FIG. 11 is a graph showing a measurement result of voltage-current density of the organic light-emitting diode that uses the iridium complex synthesized according to first and second embodiments of the present invention and Ir $(ppy)_3$ according to a comparative example as a dopant of a light-emitting layer and that introduces a new hole transfer layer (TCTA);

FIG. 12 is a graph showing a measurement result of voltage-luminescent brightness of the organic light-emitting diode that uses the iridium complex synthesized according to first and second embodiments of the present invention and Ir $(ppy)_3$ according to a comparative example as a dopant of a light-emitting layer and that introduces a new hole transfer layer (TCTA); and FIG. 13 is a graph showing a measurement result of current density-luminescent efficiency of the organic light-emitting diode that uses the iridium complex synthesized according to first and second embodiments of the present invention and Ir $(ppy)_3$ according to a comparative example as a dopant of a light-emitting layer and that introduces a new hole transfer layer (TCTA).

DETAILED DESCRIPTION OF MAIN ELEMENTS

1000, 2000: ORGANIC LIGHT-EMITTING DIODE
1100, 2100: SUBSTRATE
1110, 2110: FIRST ELECTRODE
2120: BUFFER LAYER
2130: HOLE INJECTION LAYER
2140: HOLE TRANSFER LAYER
1150, 2150: LIGHT EMITTING LAYER
2160: ELECTRON TRANSFERRING LAYER
2170: ELECTRON INJECTION LAYER
1180, 2180: SECOND ELECTRODE

[Best Mode]

Hereinafter, the embodiments of the present invention will be described in detail with reference to accompanying drawings.

Hereinafter, a preparing method of a novel iridium complex according to the present invention on the basis of exemplary embodiment of the present invention is exemplified.

However, the following embodiments are to help the understandings of the present invention and the scope of the present invention is limited thereto.

Preparing Example 1

Preparing of 9-(2-chloro-pyridine-4-yl)-9H-carbazole

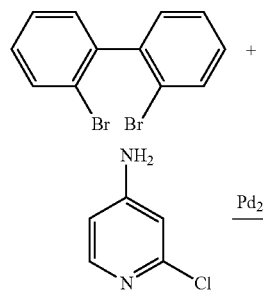

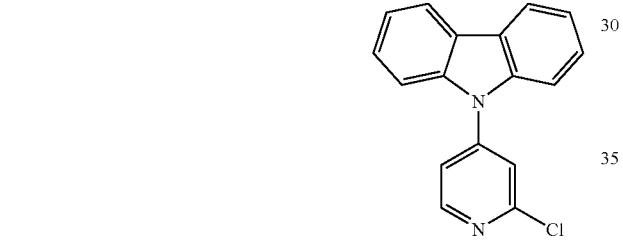

2,2'-dibromo-diphenyl (8.73 g, 27.99 mmol), 2-chloro-4-aminopyridine (3 g, 23.33 mmol), sodium tert-butoxide (5.38 g, 55.99 mmol), which is a reaction catalyst, and tris(dibenzylideneacetone)dipalladium(0) (1.07 g, 1.17 mmol) are mixed in a one neck round flat flask having a volume of 100 ml. Gas of the flask containing the mixtures is removed by using liquid nitrogen and toluene (50 ml) purified under nitrogen is added. Thereafter, it is reacted at room temperature for 10 minutes. Next, Tris-tert-butylphosphine (9.49 g, 4.67 mmol), which is another reaction catalyst, is additionally added, the reaction mixture is refluxed (110° C.) for approximately 48 hours, and whether the reaction completes is confirmed by a TLC. Thereafter, the reaction mixture is cooled at a room temperature and an organic layer is washed by using diethylether (200 ml) and brine (3×20 ml).

Water remaining in the organic layer extracted by sodium sulfate anhydride (Na$_2$SO$_4$) is removed and sodium sulfate absorbing moisture is filtered. Thereafter, a solvent is removed under a reduced pressure. The obtained remnants are separated by a flash column chromatography (eluent: EtOAc/Hexanen=1:6, v/v) to obtain 9-(2-chloro-pyridine-4-yl)-9H-carbazole that is a solid. Yield: 70.86% (6.35 g).

Preparing Example 2

Preparing of 9-[2-(4-fluoro-phenyl)-pyridine-4-yl]-9H-carbazole

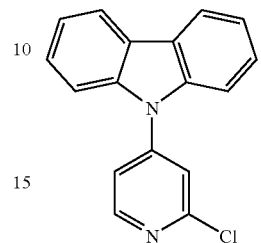

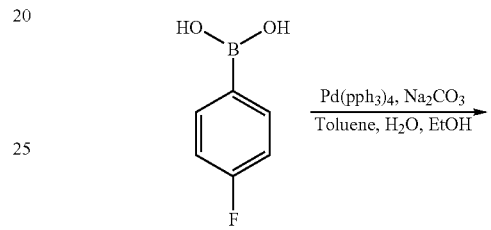

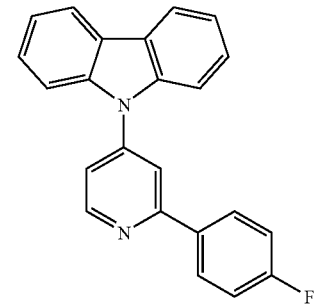

The 9-(2-chloro-pyridine-4-yl)-9H-carbazole (2 g, 7.18 mmol) obtained in the above preparing example 1 and 4-fluorophenylboroic acid (1.20 g, 8.61 mmol) are put in a one neck round flat flask having a volume of 100 ml and are mixed with tetrakis (triphenylphosphinopalladium) (1.20 g, 8.61 mmol) that is a reaction catalyst. Toluene (70 ml) purified under nitrogen is added in the flask containing reagent. Gas of the flask containing the mixtures is removed by using liquid nitrogen (twice to three times). Thereafter, 2M sodium carbonate aqueous solution (23 ml) and ethanol (4 ml) are additionally added by using a syringe under nitrogen. Herein, the sodium carbonate acts as a base during the reaction. The reaction mixture is heated at 80° C. for 12 hours and whether the reaction completes is confirmed by a TLC. Thereafter, the reaction mixture is cooled at a room temperature and an organic layer is washed by using diethylether (200 ml) and brine (3×20 ml). Water remaining in the organic layer extracted by sodium sulfate anhydride (Na$_2$SO$_4$) is removed and sodium sulfate absorbing moisture is filtered. Thereafter, a solvent is removed under a reduced pressure. The obtained remnants are separated by a flash column chromatography (eluent: EtOAc/Hexanen=1:8, v/v) to obtain 9-[2-(4-fluoro-phenyl)-pyridine-4-yl]-9H-carbazole that is a solid. Yield: 90.61% (2.2 g).

Preparing Example 3

Preparing of 9-[2-(2, 4-difluoro-phenyl)-pyridine-4-yl]-9H-carbazole

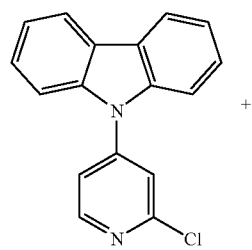

+

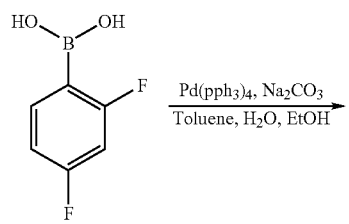

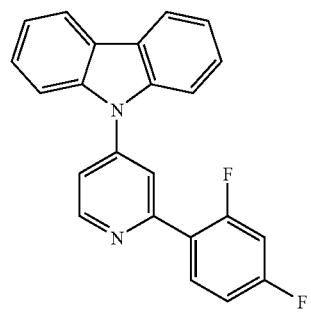

9-(2-chloro-pyridine-4-yl)-9H-carbazole (2 g, 7.18 mmol) and 2,4-difluoro-phenylboroic acid (1.36 g, 8.61 mmol) are put in a one neck round flat flask having a volume of 100 ml and tetrakis (triphenylphosphinopalladium) (0.25 g, 0.22 mmol) that is a reaction catalyst is put therein. Toluene (70 ml) purified under nitrogen is added in the flask containing reagent. Gas of the flask containing the mixtures is removed by using liquid nitrogen (twice to three times). Thereafter, 2M sodium carbonate aqueous solution (23 ml) and ethanol (4 ml) are additionally added by using a syringe under nitrogen.

Herein, the sodium carbonate acts as a base during the reaction. The reaction mixture is heated at 80° C. for 12 hours and whether the reaction completes is confirmed by a TLC.

Thereafter, the reaction mixture is cooled at a room temperature and an organic layer is washed by using diethylether (200 ml) and brine (3×20 ml). Water remaining in the organic layer extracted by sodium sulfate anhydride (Na$_2$SO$_4$) is removed and sodium sulfate absorbing moisture is filtered. Thereafter, a solvent is removed under a reduced pressure. The obtained remnants are separated by a flash column chromatography (eluent: EtOAc/Hexanen=1:8, v/v) to obtain 9-[2-(2,4-difluoro-phenyl)-pyridine-4-yl]-9H-carbazole that is a solid. Yield: 84.10% (2.15 g).

[Preparing Example 4] Preparing of chloride-bridged dimer A

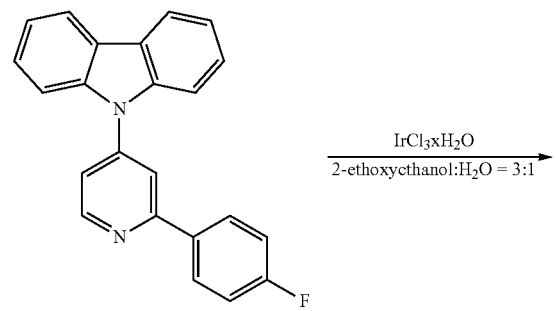

-continued

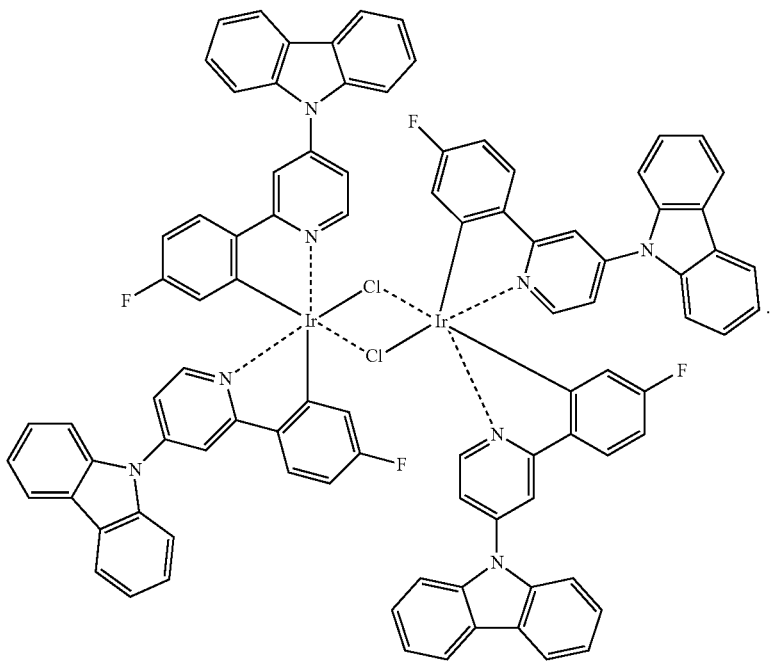

IrCl₃ 3H₂O (0.88g, 2.96mmol) and the ligand 9-[2-(4-fluoro-phenyl)-pyridine-4-yl]-9H-carbazole (2.2g, 651mmol) prepared in the preparing example 2 are mixed in a one neck round flat flask of 100 ml. 2-ethoxyethanol (90ml) and water (30ml) are mixed at a ratio of 3:1 in the flask and a solvent is added. Thereafter, this mixture is refluxed (130° C.) for 24 hours. It can be confirmed that products is generated in a solid state during the reaction. When the reaction completes, it is cooled at a room temperature. Thereafter, the products are filtered, washed with ethanol, hexane, and dithylether and then dried in a vacuum oven as it is.

Thereby, (Cvz-F₁)₂Ir (μ-Cl)₂Ir (Cvz-F₁)₂, which is intermediate compound, is obtained as a yellow solid. Yield: 93.46% (2.5 g).

Preparing Example 5

Preparing of Chloride-Bridged Dimer B

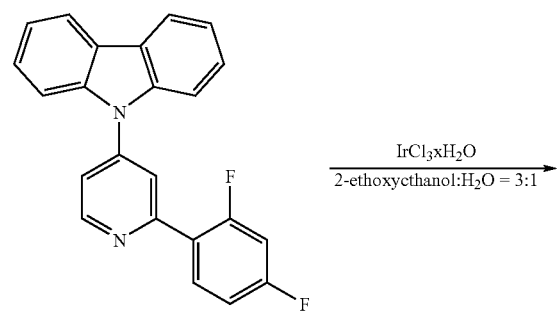

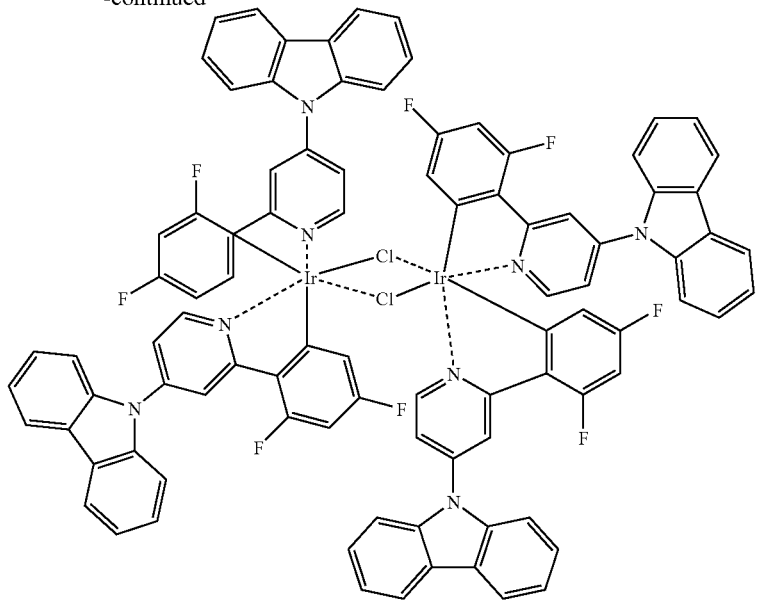

IrCl₃ 3H₂O (0.33 g, 1.09 mmol) and the ligand 9-[2-(4-difluoro-phenyl)-pyridine-4-yl]-9H-carbazole (0.93 g, 2.61 mmol) prepared in the preparing example 3 are mixed in a one neck round flat flask of 100 ml. 2-ethoxyethanol (30 ml) and water (10 ml) are mixed at a ratio of 3:1 in the flask and a solvent is added. Thereafter, this mixture is refluxed (130° C.) for 24 hours. It can be confirmed that products are generated in a solid state during the reaction. When the reaction completes, it is cooled at a room temperature.

Thereafter, the products are filtered, washed with ethanol, hexane, and dithylether and then dried in a vacuum oven as it is. Thereby, $(Cvz-F_2)_2Ir(\mu-Cl)_2Ir(Cvz-F_2)_2$ which is intermediate compound, is obtained as a yellow solid. Yield: 97.02% (1.0 g).

Example 1

Preparing Complex ($Cvz-F_1$-acac) Having Acetylacetonate as Ancillary Ligand

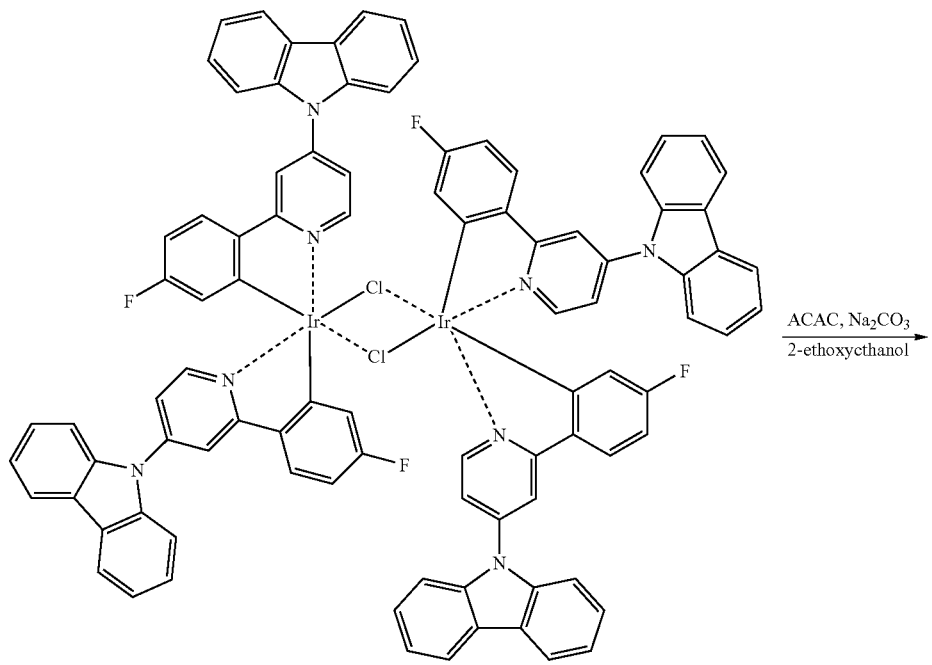

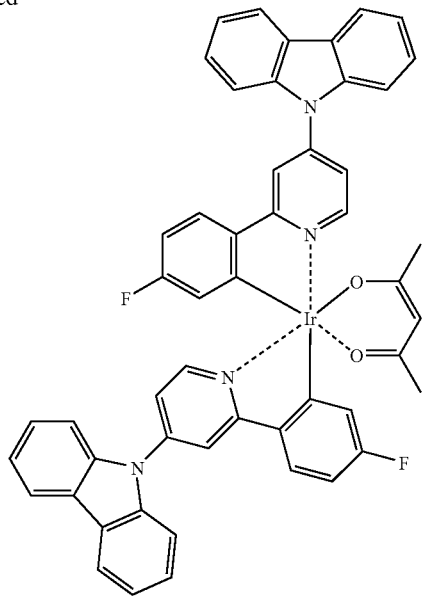

$(Cvz-F_1)_2Ir(\mu-Cl)_2Ir(Cvz-F_1)_2$ (0.7 g, 0.39 mmol), which is chloride-bridged dimer prepared in the preparing example 4, acetylacetone (0.14 g, 1.35 mmol), and $Na_2CO_3$ (0.41 g, 3.87 mmol) are put in a one neck round flat flask of 100 ml and 2-ethoxyethanol (38 ml) is added as a solvent. Thereafter, this mixture is refluxed (130° C.) for 24 hours. Whether the reaction completes is confirmed by TLC and the mixture is cooled at a room temperature. Thereafter, the products are filtered, washed with ethanol, hexane, and dithylether and then dried in a vacuum oven as it is. The obtained remnants are separated by a flash column chromatography (eluent: EtOAc/Hexanen=1:6, v/v) to obtain $Cvz-F_1$-acac, which is the iridium complex introduced with acetylacetonate as the ancillary ligand, as a yellow solid. Yield: 66.67% (0.57 g).

Example 2

Preparing of Complex ($Cvz-F_1$-pic) Having Picolinic Acid as Ancillary Ligand.

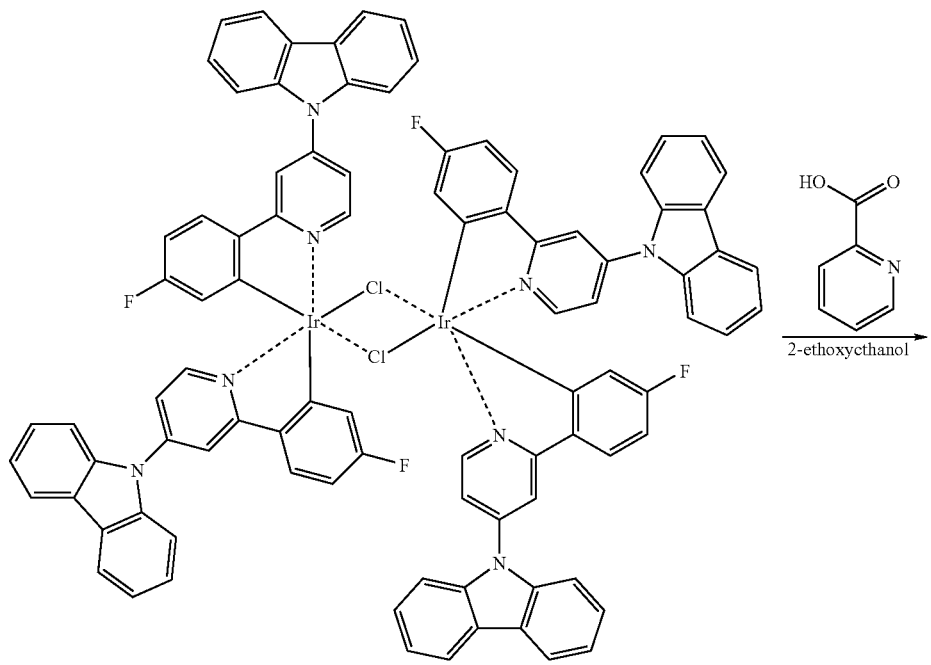

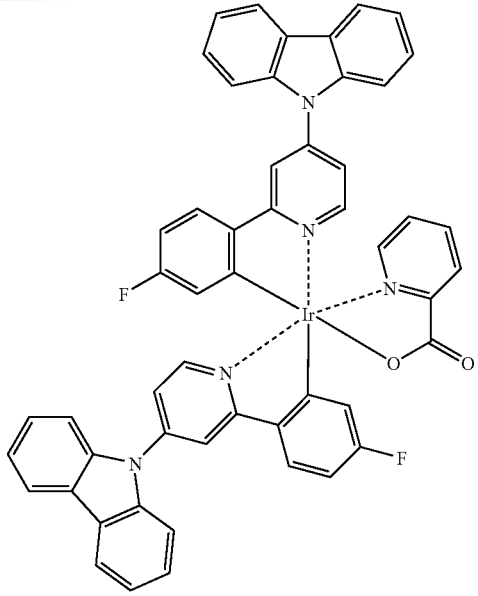

(Cvz-F$_1$)$_2$Ir(μ-Cl)$_2$Ir(Cvz-F$_1$)$_2$ (0.45 g, 0.25 mmol), which is chloride-bridged dimer prepared in the preparing example 4 and picolinic acid (0.077 g, 0.62 mmol) are put in a one neck round flat flask of 20 ml and 2-ethoxyethanol (7 ml) is added as a solvent. Thereafter, this mixture is refluxed (130° C.) for 24 hours. Whether the reaction completes is confirmed by TLC and the mixture is cooled at a room temperature.

Thereafter, the products are filtered, washed with ethanol, hexane, and dithylether and then dried in a vacuum oven as it is. The obtained remnants are separated by a flash column chromatography (eluent: EtOAc/Hexanen=1:1, v/v) to obtain Cvz-F$_1$-pic, which is the iridium complex introduced with picolinic acid as the ancillary ligand, as a yellow solid.

Yield: 82.13% (0.41 g).

Example 3

Preparing Complex (Cvz-F$_2$-acac) Having Acetylacetonate as Ancillary Ligand

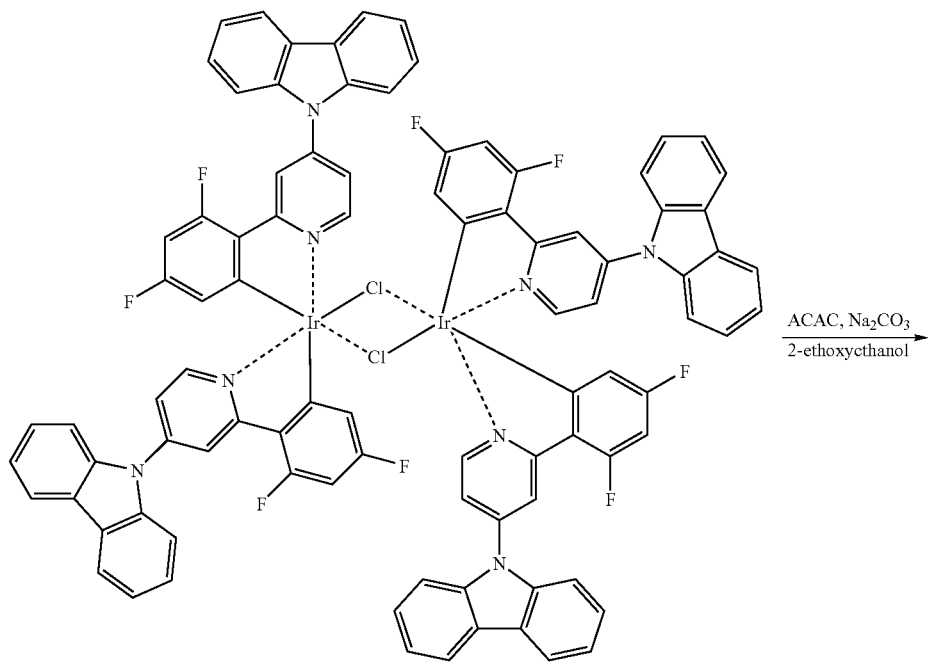

-continued

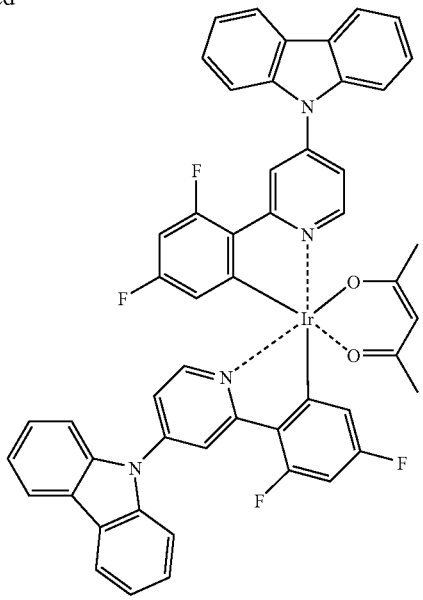

(Cvz-F$_2$)$_2$Ir(μ-Cl)$_2$Ir(Cvz-F$_2$)$_2$ (0.5 g, 0.26 mmol), which is chloride-bridged dimer prepared in the preparing example 5, acetylacetone (0.079 g, 0.79 mmol), and Na$_2$CO$_3$ (0.28 g, 2.64 mmol) are put in a one neck round flat flask of 50 ml and 2-ethoxyethanol (25 ml) is added as a solvent. Thereafter, this mixture is refluxed (130° C.) for 24 hours. Whether the reaction completes is confirmed by TLC and the mixture is cooled at a room temperature. Thereafter, the products are filtered, washed with ethanol, hexane, and dithylether and then dried in a vacuum oven as it is. The obtained remnants are separated by a flash column chromatography (eluent: EtOAc/Hexanen=1:6, v/v) to obtain Cvz-F$_2$-acac, which is the iridium complex introduced with acetylacetonate as the ancillary ligand, as a yellow solid. Yield: 66.10% (0.35 g).

Example 4

Preparing of Complex (Cvz-F$_2$-pic) Having Picolinic Acid as Ancillary Ligand.

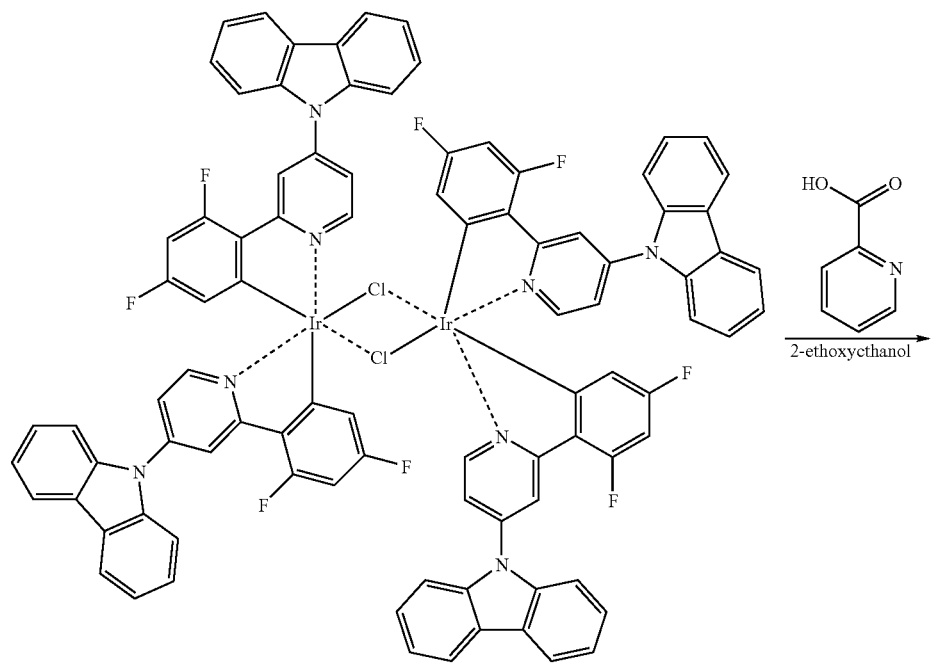

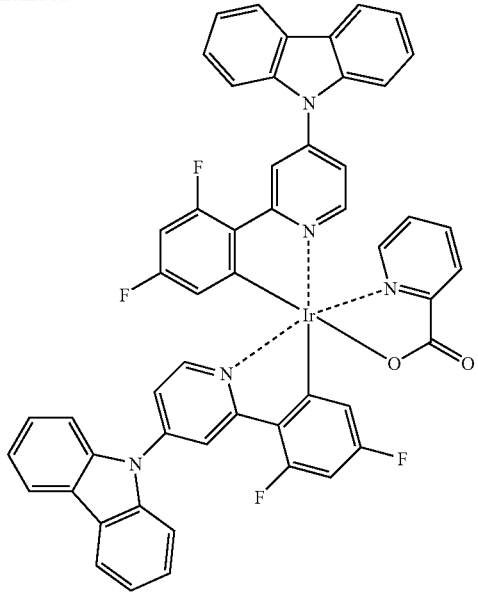

(Cvz-F$_2$)$_2$Ir(μ-Cl)$_2$Ir(Cvz-F$_2$)$_2$ (0.50 g, 0.26 mmol), which is chloride-bridged dimer prepared in the preparing example 5 and picolinic acid (0.081 g, 0.66 mmol) are put in a one neck round flat flask of 20 ml and 2-ethoxyethanol (7 ml) is added as a solvent. Thereafter, this mixture is refluxed (130° C.) for 24 hours. Whether the reaction completes is confirmed by TLC and the mixture is cooled at a room temperature.

Thereafter, the products are filtered, washed with ethanol, hexane, and dithylether and then dried in a vacuum oven as it is. The obtained remnants are separated by a flash column chromatography (eluent: EtOAc/Hexanen=1:1, v/v) to obtain Cvz-F$_2$-pic, which is the iridium complex introduced with picolinic acid as the ancillary ligand, as a yellow solid. Yield: 70.44% (0.38 g).

Example 5

Manufacturing of Electrophosphorescence Diode Containing Iridium Complexes According to the Present Invention The organic light-emitting diode is manufactured using the Cvz-F$_1$-acac (example 1), Cvz-F$_1$-pic (example 2) Cvz-F$_2$-acac (example 3), and Cvz-F$_2$-pic (example 4), which are the iridium complexes prepared according to the first to fourth examples as the dopant of the light-emitting layer.

In order to manufacture the organic light-emitting diode, a transparent electrode substrate coated with indium-tin-oxide (ITO) on a glass substrate is first washed, an anode is formed using through a micro machining process, and then, the transparent electrode substrate coated with the ITO is clearly washed again using photoresist resin and etchant.

As the hole injection layer, the poly(3,4-ethylenedioxythiophene)-poly(styrenesulfonate) (PEDOT), which is a conductive polymer, is coated at a thickness of 100 Å and is baked at 110° C. for approximately 50 minutes. As the hole transfer layer, the NPB is vacuum-deposited at a thickness of approximately 50 nm. The 1,3-bis(9-carbazolyl)benzene (mCP) used as the well known phosphorescent light-emitting layer in the art is used a host material of the light-emitting layer, the Cvz-F$_1$-acac (example 1), Cvz-F$_1$-pic (example 2) Cvz-F$_2$-acac (example 3), and Cvz-F$_2$-pic (example 4), which are the iridium complexes prepared according to the first to fourth examples is used as the dopant of the light-emitting layer, such that they are each vacuum-deposited at the concentration of the dopant of approximately 5 to 10% and at a thickness of 20 to 100 nm by vacuum deposition, thereby forming the light-emitting layer.

Cvz-F1-acac(example 1)

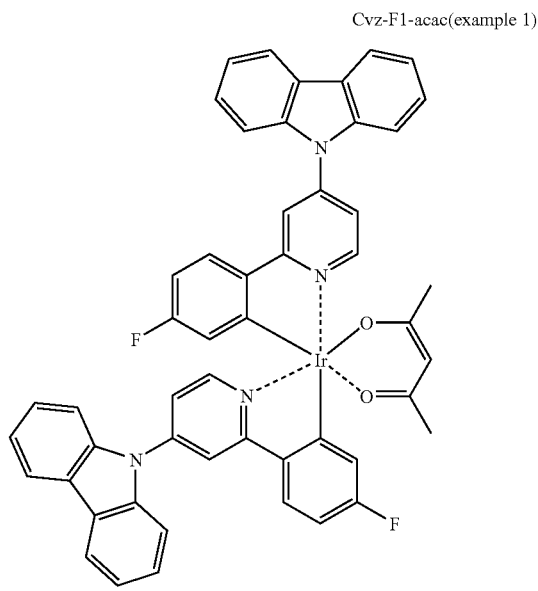

-continued

Cvz-F1-pic(example 2)

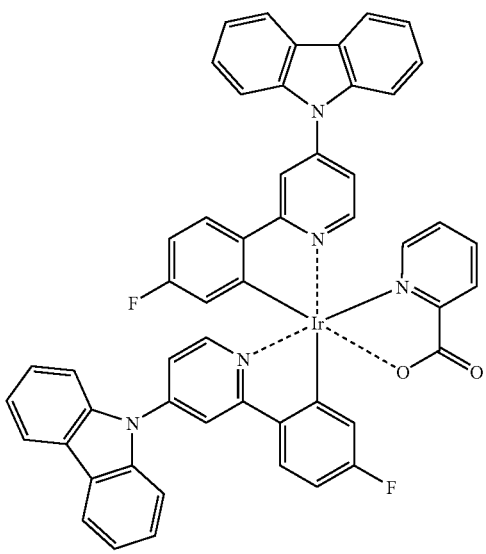

Cvz-F2-acac(example 3)

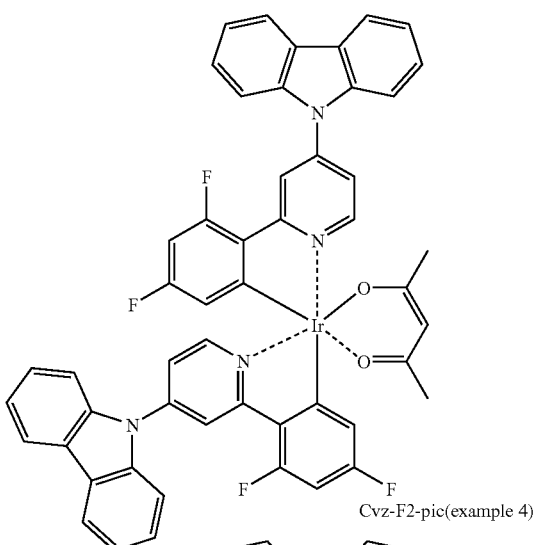

Cvz-F2-pic(example 4)

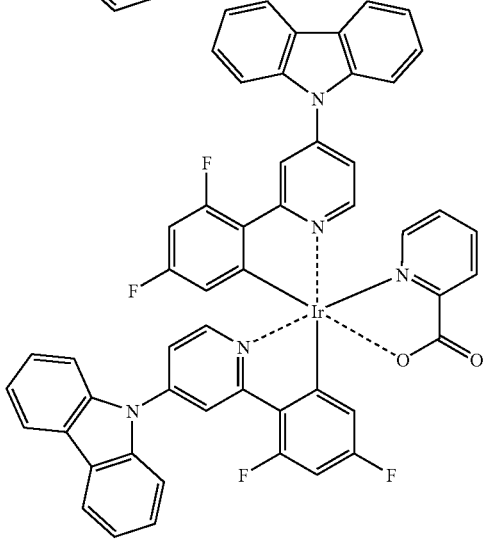

As the hole blocking layer and the electron transfer layer, the 2,9-dimethyl-4,7-diphenyl-1,10-phenanthroline (BCP) and Tris(8-hydroxyquinolinato)aluminum (Alq3) are vacuum-deposited at a thickness of 10 to 60 nm, respectively. The thin films of the LiF, which is the electron injection layer, are sequentially deposited and the Al electrode, which is the cathode, is formed, thereby manufacturing the organic light-emitting diode. The thin film is formed by the deposition while the vacuum degree for performing the vacuum deposition is maintained at $4 \times 10^{-6}$ torr. The film thickness and the growth speed of the film are controlled by using a crystal sensor at the time of performing the deposition, the light-emitting area is 4 $mm^2$, and the driving voltage uses a forward bias voltage as a direct voltage.

Comparative Example

Manufacturing of Electrophosphorescence Diode of Green Emission Using Ir(ppy)$_3$ as Dopant The present comparative example manufactures the organic light-emitting diode by the same method as the fifth example using Ir(ppy)$_3$ (fac-tris(2-phenylpyridyl)Ir(III), which is disclosed in U.S. Pat. No. 7,154,114, as the dopant of the light-emitting layer.

Experimental Example 1

Measurement of Electro-Optical Properties of Organic Light-Emitting Diode

The present experimental example measures the electro-optical properties of the organic light-emitting diode of the example 5 using the Cvz-F$_1$-acac (example 1), Cvz-F$_1$-pic (example 2) Cvz-F$_2$-acac (example 3), and Cvz-F$_2$-pic (example 4), which are the iridium complexes prepared according to the examples 1 to 4 as the dopant of the light-emitting layer and the organic light-emitting diode using the Ir(PPy)$_3$ as the dopant of the comparative example.

The current density or brightness depending on the increase in voltage of the organic light-emitting diode manufactured according to the example 5 and the organic light-emitting diode of the comparative example is measured using Keithley 236 Source Measurement Minolta 외LS-100.

FIGS. 3 and 4 are graphs showing the measurement results of voltage-current density and voltage-luminescent brightness of the electrophosphorescence diode using the Cvz-F$_1$-acac prepared according to the example 1 and the Cvz-F$_1$-pic prepared according to the example 2 as the dopant and the electrophosphorescence diode using the Ir(ppy)$_3$ of the comparative example as the dopant. FIGS. 5 and 6 are graphs showing the measurement results of voltage-current density and voltage-luminescent brightness of the electrophosphorescence diode using the Cvz-F$_2$-acac prepared according to the example 3 and the Cvz-F$_2$-pic prepared according to the example 4 as the dopant and the electrophosphorescence diode using the Ir(ppy)$_3$ of the comparative example as the dopant. As shown in FIGS. 3 to 6, the organic light-emitting diode containing the iridium complex prepared according to the present invention begins to drive at a voltage of approximately 2.5 to 7.0V and increases the amount of injected carriers as voltage increases. As a result, it can be appreciated that the current density and the luminescent brightness exponentially increase.

FIGS. 7 and 8 are graphs showing the properties of voltage-current density-light-emitting efficiency of the electrophosphorescence diode using the Cvz-F$_1$-acac prepared according to the example 1, the Cvz-F$_1$-pic prepared according to the example 2, the Cvz-F$_2$-acac prepared according to the example 3, and the Cvz-F$_2$-pic prepared according to the example 4 as the dopant and the electrophosphorescence diode using the Ir(ppy)$_3$ of the comparative example as the dopant.

Meanwhile, FIGS. 9 and 10 are graphs showing the measurement results of EL intensity of the electrophosphorescence diode using the Cvz-F$_1$-acac prepared according to the example 1, the Cvz-F$_1$-pic prepared according to the example 2, the Cvz-F$_2$-acac prepared according to the example 3, and the Cvz-F$_2$-pic prepared according to the example 4 as the dopant and the electrophosphorescence diode using the Ir(ppy)$_3$ of the comparative example as the dopant.

As shown, it can be confirmed that the organic light-emitting diode using the iridium complex according to the present invention as the dopant of the light-emitting layer can control the maximum light-emitting peak from approximately 480 nm to approximately 514 nm and control the light-emitting properties from blue to sea green.

On the other hand, the electrophosphorescence diode using the Ir(ppy)$_3$ as the dopant, which is reported as the phosphorescent compound of green emission in the art according to the comparative example, is indicative of the maximum light-emitting peak of green at approximately 514 nm.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

[Industrial Applicability]

The novel iridium complex according to the present invention is the iridium complex into which the carbazole-substituted pyridine derivatives and various substituents-substituted phenyl derivatives are introduced as the main ligand and is more excellent skeleton compound in properties than the known iridium light-emitting material in the art.

The novel iridium complex according to the present invention shows the excellent EL property than the known material in the art. Further, the novel iridium complex according to the present invention can be easily melted in the organic solvent, making it possible to maintain the large light-emitting area.

In other words, the iridium complex can implement the light-emitting colors from pure blue to sea green when comparing the known iridium light-emitting material in the art by introducing the carbazole-substituted pyridine derivatives and the various substituents-substituted phenyl derivatives as the main ligand and introducing the various ancillary ligands such as acetylacetone, picolinic acid, and the like. As a result, the electrophosphorescence diode, which can control the light-emitting colors from blue to sea green by using the iridium complex according to the present invention as the dopant of the light-emitting layer, can be manufactured.

Also, the iridium complex according to the present invention can be used the light-emitting material, which is soluble in a general organic solvent, has the excellent heat-resistance property, has excellent interface property with the electrode, and has the improved thin film property and light-emitting efficiency.

The invention claimed is:

1. An iridium complex represented by Chemical Formula (1):

[Chemical Formula 1]

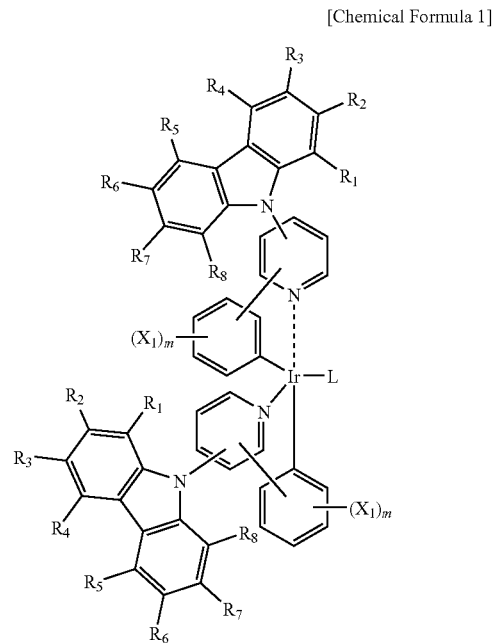

[wherein, L is organic ligand;

R$_1$ to R$_8$ independently represents hydrogen, linear or branched and saturated or unsaturated (C$_1$-C$_{20}$) alkyl with or without halogen substituent(s), (C$_3$-C$_{12}$) cycloalkyl, or (C$_3$-C$_{12}$) cycloalkyl (C$_1$-C$_{20}$) alkyl;

X$_1$ represents hydrogen, halogen, cyano, linear or branched and saturated or unsaturated (C$_1$-C$_{20}$) alkyl, (C$_1$-C$_{20}$) alkoxy, tri (C$_1$-C$_{20}$) alkylsilyl, tri (C$_5$-C$_{20}$) arylsilyl, (C$_3$-C$_{12}$) cycloalkyl, or (C$_5$-C$_{20}$) aryl, and the alkyl, alkoxy, or aryl of X$_1$ may be further substituted by one or more substituent(s) selected from halogen, (C$_1$-C$_{20}$) alkylsilyl, (C$_5$-C$_{20}$) arylsilyl, mono or di (C$_1$-C$_{20}$) alkylamino, or amino;

m is an integer of 1 to 4.]

2. An iridium complex according to claim 1, wherein the ligand L is selected from following structures:

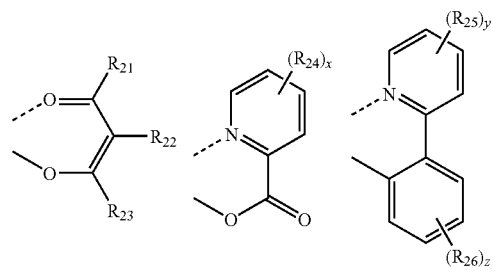

[wherein, $R_1$ to $R_{23}$ independently represent hydrogen, linear or branched and saturated or unsaturated ($C_1$-$C_{10}$) alkyl with or without halogen substituent(s), phenyl with or without ($C_1$-$C_{10}$) alkyl substituent(s) or halogen; $R_{24}$ to $R_{26}$ independently represent hydrogen, linear or branched and saturated or unsaturated ($C_1$-$C_{10}$) alkyl with or without halogen substituent(s), ($C_1$-$C_{10}$) alkylsilyl, or halogen; $R_{27}$ represents linear or branched and saturated or unsaturated ($C_1$-$C_{10}$) alkyl with or without halogen substituent(s), phenyl with or without ($C_1$-$C_{10}$) alkyl substituent(s), or halogen; x, y, and z are independently an integer 1 to 4.]

3. An iridium complex according to claim 2, wherein the ligand L is selected from following structures:

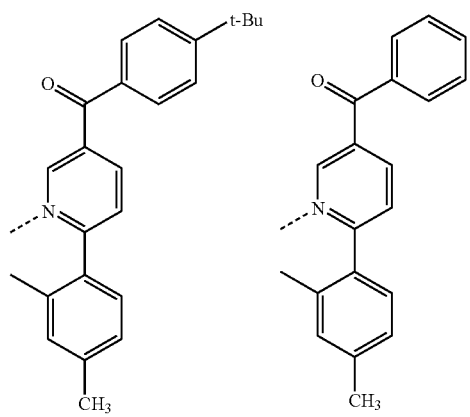

4. An iridium complex according to claim 3, wherein $R_1$ to $R_8$ independently represent hydrogen, methyl, ethyl, n-propyl, i-propyl, n-butyl, t-butyl, cyclopropyl, cyclobutyl, cyclopentyl, cyclohexyl, cycloheptyl, cyclopropylmethyl, or cyclobutylmethyl; $X_1$ represents hydrogen, fluoro (F), cloro (Cl), cyano, methyl, ethyl, n-propyl, i-propyl, n-butyl, i-butyl, t-butyl, methoxy, ethoxy, n-propoxy, t-butoxy, trifluoromethyl, trimethylsilyl, triphenylsilyl, cyclopropyl, cyclobutyl, cyclohexyl, phenyl, naphthyl, anthryl, aminomethyl, aminoethyl, or aminobutyl; m is an integer 1 or 2.

5. An iridium complex according to claim 4, wherein the iridium complex is selected from the following compounds:

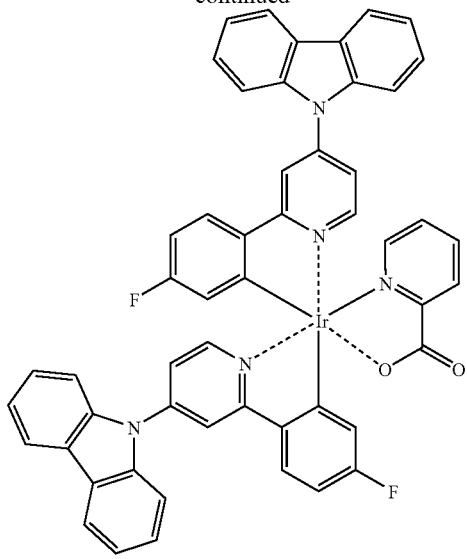

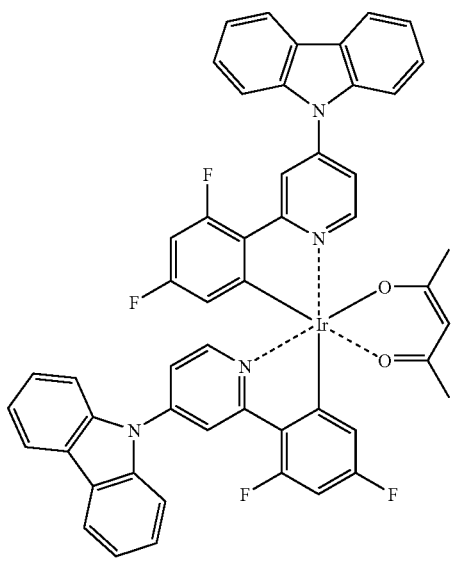

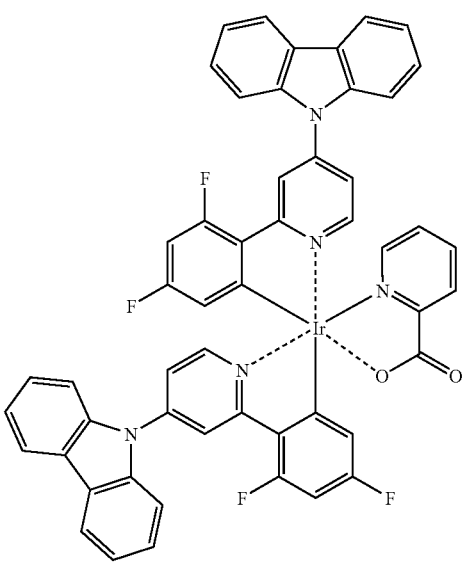

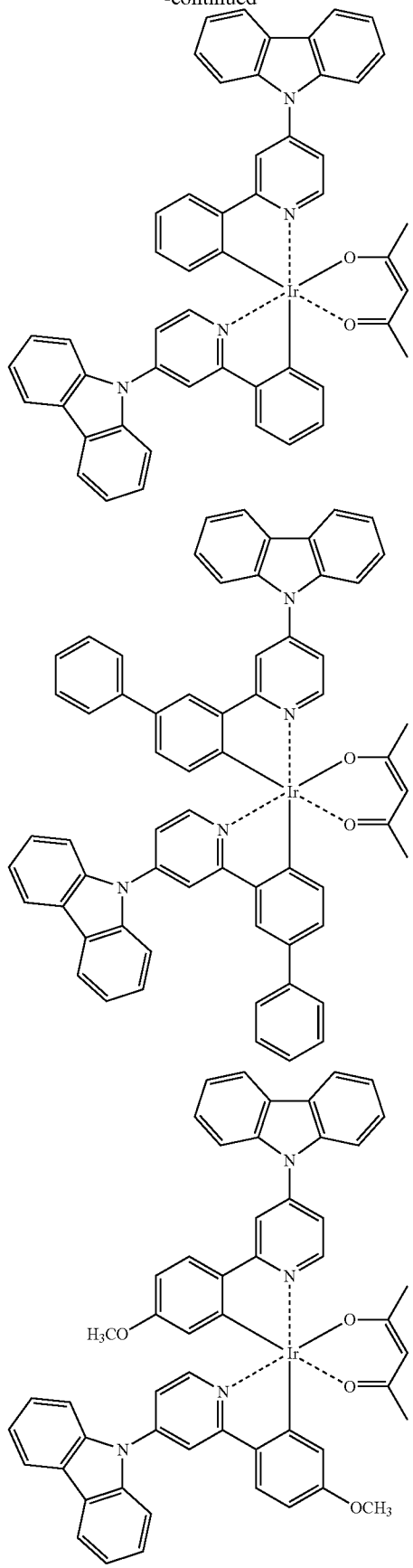
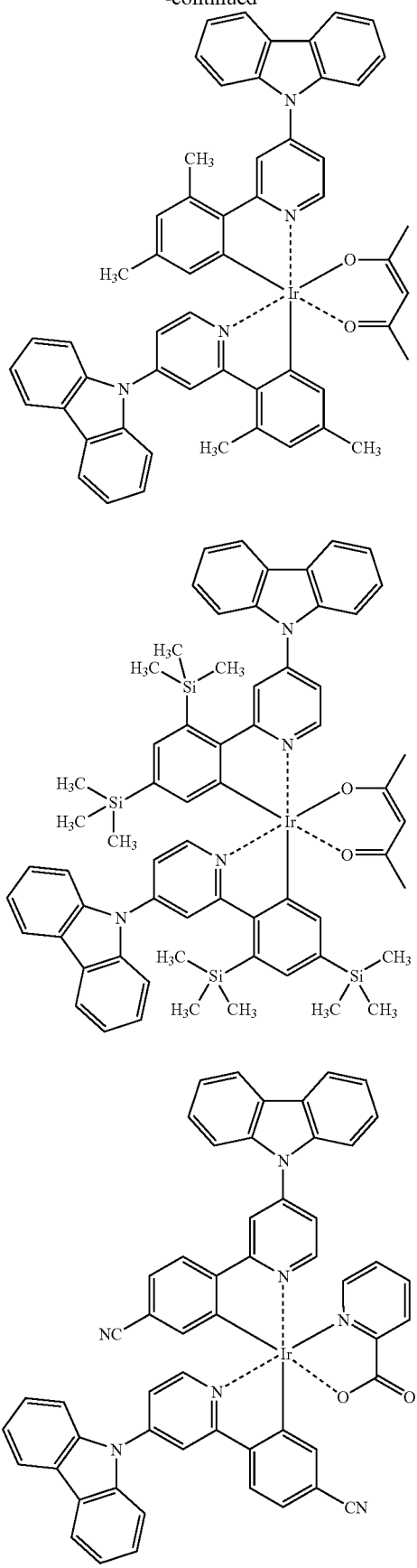

-continued

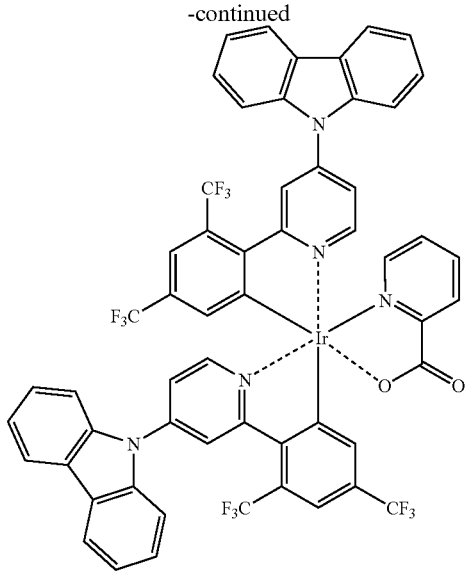

6. An organic light-emitting diode containing an iridium complex according to any one of claims 1 to 5.

7. An organic light-emitting diode according to claim 6, wherein organic light-emitting diode includes:
   a first electrode;
   a light-emitting layer including the iridium complex; and
   a second electrode.

8. An organic light-emitting diode according to claim 7, wherein the organic light-emitting diode includes a buffer layer between the first electrode and the light-emitting layer and includes an electron transfer layer and an electron injection layer between the light-emitting layer and the second electrode.

9. An organic light-emitting diodes according to claim 8, wherein the buffer layer includes a hole injection layer and a hole transfer layer.

10. An organic light-emitting diode according to claim 6, wherein the iridium complex is used as a dopant of a light-emitting layer.

* * * * *